United States Patent
Iwamatsu

(10) Patent No.: US 6,215,197 B1
(45) Date of Patent: *Apr. 10, 2001

(54) SEMICONDUCTOR DEVICE HAVING A TRENCH ISOLATION STRUCTURE AND AN ALIGNMENT MARK AREA

(75) Inventor: Toshiaki Iwamatsu, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/990,075

(22) Filed: Dec. 12, 1997

(30) Foreign Application Priority Data

Aug. 25, 1997 (JP) .................................................. 9-228034

(51) Int. Cl.$^7$ ............................ H01L 23/544; H01L 21/76
(52) U.S. Cl. ............................................ 257/797; 438/401
(58) Field of Search ............................ 257/797; 438/401, 438/462, 975

(56) References Cited

U.S. PATENT DOCUMENTS

| | | | |
|---|---|---|---|
| 5,316,966 | 5/1994 | Van Der Plas et al. | 438/401 |
| 5,369,050 | 11/1994 | Kawai | 438/401 |
| 5,578,519 | 11/1996 | Cho | 438/401 |
| 5,893,744 | * 4/1999 | Wang | 438/401 |

FOREIGN PATENT DOCUMENTS

| | | |
|---|---|---|
| 60-97639 | 5/1985 | (JP) . |
| 239599 | 1/1995 | (JP) . |
| 243545 | 3/1995 | (JP) . |
| 7-176463 | 7/1995 | (JP) . |
| WO 94/05037 | 3/1994 | (WO) . |

* cited by examiner

Primary Examiner—Steven Loke
Assistant Examiner—Hung Kim Vu
(74) Attorney, Agent, or Firm—Oblon, Spivak, McClelland, Maier & Neustadt, P.C.

(57) ABSTRACT

A resist pattern (51) is formed only on buried silicon oxide films (2) on the whole surface of an alignment mark area (11A) and a trench (10C). With the resist pattern (51), preetching is performed by dry etching, to remove the silicon oxide film (2) on the whole of a memory cell area (11B) and part of a peripheral circuit area (11C) by a predetermined thickness. After removing the resist pattern (51), a silicon oxide film (3) and a silicon nitride film (4) are removed by CMP polishing, to provide a height difference between the highest portion and the lowest portion of the silicon oxide film (2A) which serves as an alignment mark. Thus, a semiconductor device with trench isolation structure which achieves a highly accurate alignment without deterioration of device performance and a method for manufacturing the semiconductor device can be provided.

5 Claims, 26 Drawing Sheets

*FIG. 1*
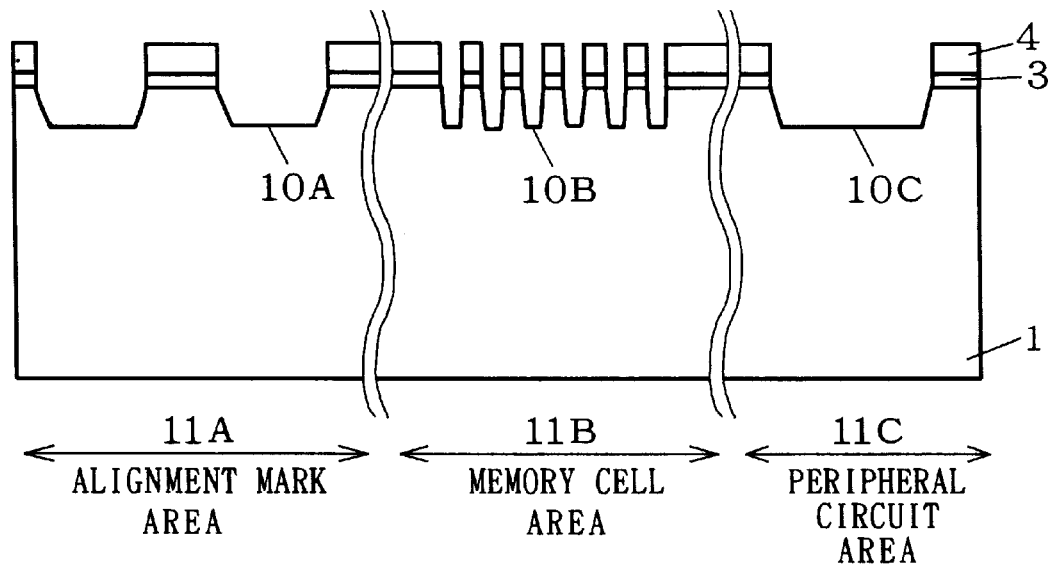
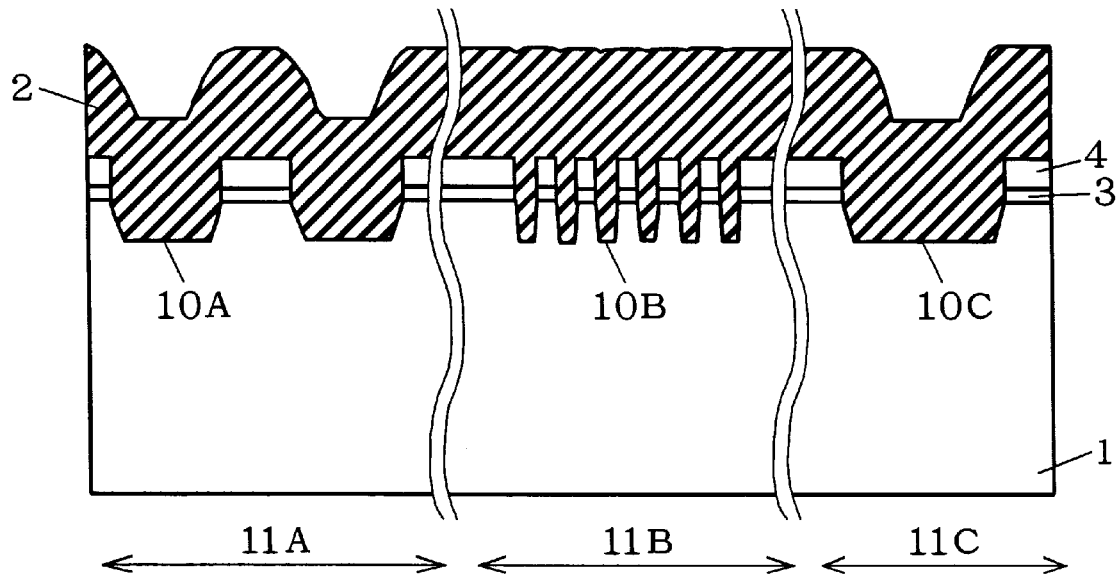
*FIG. 2*

SEMICONDUCTOR DEVICE HAVING A TRENCH ISOLATION STRUCTURE AND AN ALIGNMENT MARK AREA

BACKGROUND OF THE INVENTION

1. Field of the Invention

The present invention relates to a semiconductor device and a method for manufacturing the same, and more particularly to an alignment mark used for superimpose the first electrode on an element active region with high accuracy in a semiconductor device with trench isolation structure.

2. Description of the Background Art

FIGS. 45 to 51 are cross sections showing steps for manufacturing a semiconductor device with trench isolation structure in the background art. The manufacturing method will be discussed below, with reference to these figures.

First, a silicon oxide film 3 and a silicon nitride film 4 are formed on a silicon substrate 1 in this order. With a field mask, the silicon oxide film 3 and the silicon nitride film 4 are patterned. The resist used for the patterning is removed and a dry etching of 2000 to 4000 Å is performed to form trenches 10 (10A to 10C) having a predetermined depth in the silicon substrate 1 as shown in FIG. 45. Specifically, relatively wide trenches 10A are formed in an alignment mark area 11A, narrow trenches 10B are formed in a memory cell area 11B and wide trenches 10C are formed in a peripheral circuit area 11C. Thus, the trenches 10A and 10C in the alignment mark area 11A and the peripheral circuit area 11C are formed in a loose pattern and the trenches 10B in the memory cell 11B are formed in a dense pattern.

Subsequently, as shown in FIG. 46, side surfaces and bottom surfaces of the trenches 10A to 10C are oxidized by thermal oxidation and then a silicon oxide film 2 is deposited by CVD. While the silicon oxide film 2 on the wide trenches 10A and 10C is as thick as the deposited film, the silicon oxide film 2 on the narrow trench 10B is thicker than the deposited film since the insulating film is buried into the narrow trenches at an early stage of deposition. In other words, there is a difference in thickness between the silicon oxide film 2 on the trenches 10B and that on the trenches 10A and 10C. The difference is referred to as a thickness difference of silicon oxide film on trench.

In order to reduce the thickness difference of silicon oxide film on trench, a resist pattern 5 is formed only on the buried silicon oxide films 2 on the wide trenches 10A and 10C with a mask which is different from the field mask, as shown in FIG. 47, and then a dry etching is performed to remove part of the silicon oxide film which is convex. Hereinafter, this step is referred to as preetching in some cases.

After removing the resist pattern 5, the whole surface is entirely polished by CMP (Chemical Mechanical Polishing), as shown in FIG. 48, to remove the silicon oxide film on the silicon nitride film 4 and part of the silicon oxide film on the trenches 10A to 10C.

Next, as shown in FIG. 49, the silicon nitride film 4 is removed with phosphoric acid and the silicon oxide film 3 is removed with hydrofluoric acid, to form a buried silicon film 2A in the alignment mark area 11A, a buried silicon film 2B in the memory cell area 11B and a buried silicon film 2C in the peripheral circuit area 11C which constitute a trench isolation structure.

Subsequently, as shown in FIG. 50, a gate oxide film 6 is formed by thermal oxidation and a polysilicon film 7 doped with phosphorus and a tungsten silicide film 8 are formed on the gate oxide film 6 in this order.

Next, as shown in FIG. 51, with the buried silicon oxide film 2A (alignment mark) which is formed on the step of forming the isolation structure in the alignment mark area 11A, a pattern for superimposing a gate electrode on an isolation region is formed by photolithography, and gate electrodes 14 are formed in the memory cell area 11B and the peripheral circuit area 11C through partially removing part of the tungsten silicide film 8 and the polysilicon film 7 by dry etching.

The semiconductor device and the method for manufacturing the same in the background art as discussed above have the following problem.

In patterning of the gate electrode 14 made of the first electrode material, to form a pattern in a predetermined portion of the active region, it is necessary to superimpose it on the active region. For this superimposition, the alignment mark 2A which is formed in the step of forming the isolation structure in the alignment mark area 11A is used.

In the semiconductor device with trench isolation structure, however, it is difficult to detect the mark by the height difference of surface since there is little difference in height of the alignment mark. Moreover, since a silicide film which is part of the gate electrode material reflects light (monochromatic light (wavelength: 633 m)) and white light (wavelength: 530 to 800 m), not passing light, it is also difficult to detect the mark by image recognition.

With difficulties of the mark detection, the accuracy of alignment becomes lower and therefore it disadvantageously becomes impossible to achieve accurate superimposition of gate masks for formation of gate electrode.

SUMMARY OF THE INVENTION

The present invention is directed to a semiconductor device in which semiconductor elements are isolated with a trench isolation structure. According to a first aspect of the present invention, the semiconductor device comprises: a semiconductor substrate; an alignment mark area provided on the semiconductor substrate, having a first trench in an upper portion of the semiconductor substrate and an alignment insulating film provided in the first trench; and an element formation area provided on the semiconductor substrate, having an isolation insulating film used for isolating a plurality of semiconductor elements, the isolation insulating film filling a second trench provided in the upper portion of the semiconductor substrate. In the semiconductor device of the first aspect, the alignment insulating film has a height difference with the highest portion of the alignment insulating film being higher than a surface of the semiconductor substrate and a surface of the lowest portion being lower than the surface of the semiconductor substrate.

According to a second aspect of the present invention, the semiconductor device comprises: a semiconductor substrate; an alignment mark area provided on the semiconductor substrate, having a first trench in an upper portion of the semiconductor substrate and an alignment insulating film provided in the first trench, the alignment insulating film being formed in a peripheral portion other than a center portion of the first trench; and an element formation area provided on the semiconductor substrate, having an isolation insulating film used for isolating a plurality of semiconductor elements, the isolation insulating film filling a second trench provided in the upper portion of the semiconductor substrate, a bottom surface of the center portion of the first trench being formed deeper than the a bottom surface of the second trench. In the semiconductor device of the second aspect, the alignment insulating film has a height difference between the highest portion and the bottom surface of the center portion.

According to a third aspect of the present invention, in the semiconductor device, the semiconductor substrate includes an SOI substrate having an underlying substrate, a buried insulating film formed on the underlying substrate and an SOI layer formed on the buried insulating film, and the first and second trenches penetrate the SOI layer and the center portion of the first trench is formed by further removing a part of the buried insulating film.

According to a fourth aspect of the present invention, the semiconductor device further comprises: a control electrode provided on the element formation area, for controlling a device operation; an interlayer insulating film provided on the semiconductor substrate including the control electrode and a portion above the first trench; a first through hole penetrating the interlayer insulating film, the center portion of the first trench and the buried insulating film to reach the underlying substrate; a second through hole penetrating the interlayer insulating film to reach the control electrode; and an interconnection layer electrically connected to the control electrode through the second through hole.

According to a fifth aspect of the present invention, the semiconductor device further comprises an element-on-underlying-substrate formation area being the underlying substrate in which semiconductor elements are formed.

The present invention is also directed to a method for manufacturing a semiconductor device with trench isolation structure. According to a sixth aspect of the present invention, the method comprises the steps of: (a) preparing a semiconductor substrate having an alignment mark area and an element formation area; (b) forming first and second trenches at one time in upper portions of the alignment mark area and the element formation area of the semiconductor substrate, respectively, the first and second trenches having almost the same depth at their bottom surfaces from a surface of the semiconductor substrate; (c) forming an insulating film entirely on the surface of the semiconductor substrate; (d) forming a resist pattern at least on the insulating film corresponding to the peripheral vicinity region external to the first trench in the alignment mark area; (e) removing the insulating film with the resist pattern used as a mask; (f) further removing the insulating film after removing the resist pattern, the step (f) being performed so as to leave a part of the insulating film in the first trench and the insulating film which is buried in the second trench, the first trench after the step (f) being defined as an alignment mark; (g) forming an electrode layer entirely on the semiconductor substrate; and (h) recognizing a position of the alignment mark to pattern the electrode layer on the element formation area. In the method of the sixth aspect, the alignment mark has a height difference between a center portion of the first trench and a peripheral portion other than the center portion.

According to a seventh aspect of the present invention, in the method, the resist pattern is further formed on the insulating film corresponding to the first trench in the alignment mark area in the step (d), and the alignment mark includes an alignment insulating film which is the insulating film left in the first trench after the step (f), the alignment insulating film being formed so that the highest portion of the alignment insulating film formed on the peripheral portion becomes higher than the surface of the semiconductor substrate and a surface of the alignment insulating film formed on the center portion becomes lower than the surface of the semiconductor substrate to have a height difference.

According to an eighth aspect of the present invention, in the method, the resist pattern is formed only on the insulating film corresponding to the peripheral vicinity region of the first trench in the alignment mark area in the step (d), the step (f) includes the step of removing the insulting film on the center portion of the first trench while leaving the insulating film on the peripheral portion of the first trench as the alignment insulating film and removing a part of the semiconductor substrate beneath the center portion of the first trench, the part of the semiconductor substrate which is removed being defined as the deepest portion of the first trench, and the alignment mark includes the alignment insulating film and the first trench, and has a height difference between the highest portion of the alignment insulating film and a bottom surface of the deepest portion of the first trench.

According to a ninth aspect of the present invention, in the method, the semiconductor substrate includes an underlying substrate, a buried insulating film formed on the underlying substrate, and an SOI layer formed on the buried insulating film, the step (b) includes the step of forming the first and second trenches so as to penetrate the SOI layer, and the part of the semiconductor substrate which is removed in the step (f) includes a part of the buried insulating film.

According to a tenth aspect of the present invention, in the method, the electrode layer patterned in the step (h) is formed on the element formation area and includes a control electrode for controlling a device operation, and the method further comprises the steps of: (i) entirely forming an interlayer insulating film; (j) forming first and second through holes on the interlayer insulating film formed on the center portion of the first trench and the control electrode, respectively, the first through hole being formed so as to further penetrate the buried insulating film to reach the underlying substrate; (k) forming a metal layer on the interlayer insulating film including the first and second through holds; and (l) patterning the metal layer to form an interconnection layer.

According to an eleventh aspect of the present invention, in the method, the semiconductor substrate further includes a circuit-on-underlying-substrate area, the step (b) includes the step of forming a third trench penetrating the SOI layer and being wider than each of the first and second trenches, no resist pattern is formed on the third trench in the step (d), and the step (f) includes the step of removing all the insulating film on the third trench and the buried insulating film beneath the third trench to expose the underlying substrate.

According to a twelfth aspect of the present invention, in the method, the second trench includes a first circuit trench being relatively narrow and a second circuit trench being relatively wider, the element formation area includes a first circuit formation area isolated by the first circuit trench and a second circuit formation area isolated by the second circuit trench, and no resist pattern is formed on the insulating film corresponding to the first circuit formation area and the resist pattern is formed on the insulating film corresponding to the second circuit formation area in the step (d).

According to a thirteenth aspect of the present invention, in the method, the first circuit formation area includes an area constituted of dynamic memory cells, and the second circuit formation area includes an area in which peripheral circuits for driving the memory cells are formed.

According to a fourteenth aspect of the present invention, the method comprises the steps of: (a) preparing a semiconductor substrate having an alignment mark area and an element formation area, the semiconductor substrate including an SOI substrate consisting of an underlying substrate, a buried insulating film formed on the underlying substrate and an SOI layer formed on the buried insulating film; (b) forming first and second trenches at one time on the alignment mark area and the element formation area, respectively, so as to penetrate the SOI layer; (c) forming an insulating film entirely on the surface of the SOI layer including the first and second trenches; (d) removing the insulating film, the step (d) being performed so as to leave the insulating film which is buried in the second trench and remove all the insulting film on the center portion of the first trench while leaving the insulating film on the peripheral portion of the first trench as the alignment insulating film and further remove a part of the buried insulating film beneath the center portion of the first trench, the part of the semiconductor substrate which is removed being defined as the deepest portion of the first trench; (e) forming an electrode layer entirely on the semiconductor substrate; and (f) recognizing a position of the alignment mark and patterning the electrode layer on the element formation area. In the method of the fourteenth aspect, the alignment mark has a height difference between the highest portion of the alignment insulating film and a bottom surface of the deepest portion of the first trench.

According to a fifteenth aspect of the present invention, in the method, the second trench includes first and second circuit trenches being relatively narrow, the second circuit trench including a plurality of second circuit trenches, the plurality of second circuit trenches being formed so as to sandwich the SOI layer, the SOI layer sandwiched between the plurality of second circuit trenches being defined as a dummy layer, and the element formation area includes a first circuit formation area isolated by the first circuit trench and a second circuit formation area isolated by the plurality of second circuit trenches and the dummy layer.

According to a sixteenth aspect of the present invention, in the method, the electrode layer patterned in the step (i) is formed on the element formation area and includes a control electrode for controlling a device operation, and the method further comprises the steps of: (g) entirely forming an interlayer insulating film; (h) forming first and second through holes on the interlayer insulating film formed on the center portion of the first trench and the control electrode, respectively, the first through hole being formed so as to further penetrate the buried insulating film to reach the underlying substrate, (i) forming a metal layer on the interlayer insulating film including the first and second through holes; and (l) patterning the metal layer to form an interconnection layer.

According to a seventeenth aspect of the present invention, in the method, the semiconductor substrate further includes a circuit-on-underlying-substrate area, the step (b) includes the step of forming a third trench penetrating the SOI layer and being wider than each of the first and second trenches, and the step (d) includes the step of removing all the insulating film on the third trench and the buried insulating film beneath the third trench to expose the underlying substrate.

According to an eighteenth aspect of the present invention, in the method, the first circuit formation area includes an area constituted of dynamic memory cells, and the second circuit formation area includes an area in which peripheral circuits for driving the memory cells are formed.

In the semiconductor device of the first aspect of the present invention, the alignment insulating film has a height difference with the highest portion of the alignment insulating film being higher than the surface of the semiconductor substrate and the surface of the lowest portion being lower than the surface of the semiconductor substrate.

Therefore, even when an upper formation layer is formed on the semiconductor substrate including the alignment insulating film, the upper formation layer has another height difference reflecting the height difference of the alignment insulating film. It becomes easier to perform positional detection of the alignment mark with the height difference in the upper formation layer and a semiconductor device which is manufactured with high accuracy in positioning can be provided.

In the semiconductor device of the second aspect of the present invention, the alignment insulating film has a height difference between the highest portion and the bottom surface of the center portion of the first trench.

Therefore, even when the upper formation layer is formed on the semiconductor substrate including the alignment insulating film and the first trench, the upper formation layer has another height difference reflecting the height difference of the alignment insulating film. It becomes easier to perform positional detection of the alignment mark with the height difference in the upper formation layer and a semiconductor device which is manufactured with high accuracy in positioning can be provided.

In the semiconductor device of the third aspect of the present invention, since the first trench penetrates the SOI layer in the SOI substrate, a semiconductor device which is manufactured with high accuracy in positioning, like the semiconductor device of the second aspect, can be provided.

The semiconductor device of the fourth aspect of the present invention comprises the interlayer insulating film, the first through hole penetrating the deepest portion of the first trench and the interlayer insulating film to reach the underlying substrate, the second through hole penetrating the interlayer insulating film to reach the control electrode and the interconnection layer electrically connected to the control electrode through the second through hole.

When the interconnection layer is formed by etching after formation of the metal layer on the whole surface of the interlayer insulating film, the interconnection can be obtained with no etching damage since the underlying substrate and the control electrode are electrically connected to each other through the first and second through holes to reduce the potential difference therebetween, and a semiconductor device with excellent operation performance can be provided.

Moreover, since the deepest portion of the first trench is formed by removing a part of the buried insulating film, formation of the first through hole penetrating the buried insulating film beneath the deepest portion becomes relatively easy.

Since the semiconductor device of the fifth aspect of the present invention further comprises the element-on-underlying-substrate formation area being the underlying substrate in which semiconductor elements are formed, a semiconductor device in which semiconductor elements are formed in the underlying substrate as well as the SOI layer of the SOI substrate can be provided.

In the method for the semiconductor device of the sixth aspect of the present invention, by forming the resist pattern at least on the insulating film corresponding to the peripheral vicinity region external to the first trench in the alignment mark area in the step (d), removing the insulating film with the resist pattern used as a mask in the step (e) and further entirely removing the insulating film after removing the resist pattern in the step (f), the alignment mark has a height difference between the center portion and the peripheral portion in the first trench.

Therefore, since the electrode layer formed on the alignment mark has another height difference reflecting the height difference of the alignment mark, positional detection of the alignment mark in the step (h) becomes easy with the height difference in the electrode layer and patterning of the electrode layer is achieved on the basis of the alignment mark with high accuracy.

Since the resist pattern used in the step (e) is formed at least on the insulating film corresponding to the peripheral vicinity region external to the first trench in the alignment mark area, it is possible to prevent deterioration in detection accuracy of the alignment mark due to rounding of a fringe portion of the first trench as the result of removing the semiconductor substrate in the peripheral vicinity region of the first trench together with the insulating film after the step (f).

In the method for the semiconductor device of the seventh aspect of the present invention, the resist pattern used in the step (e) is further formed on the insulating film corresponding to the first trench in the alignment mark area, and the alignment mark includes the alignment insulating film which is the insulating film formed in the first trench, the alignment insulating film being formed so that the highest portion of the alignment insulating film formed on the peripheral portion is higher than the surface of the semiconductor substrate and the alignment insulating film formed on the center portion is lower than the surface of the semiconductor substrate to have a height difference.

Therefore, since the electrode layer formed on the alignment insulating film has another height difference reflecting the height difference of the alignment mark, the height difference of the electrode layer itself can be used as the alignment mark.

In the method for the semiconductor device of the eighth aspect of the present invention, the resist pattern is formed only on the insulating film corresponding to the peripheral vicinity region of the first trench in the alignment mark area, and the alignment mark includes the alignment insulating film and the first trench and has the height difference between its highest portion and the bottom surface of the deepest portion of the first trench.

Therefore, since the electrode layer formed on the alignment insulating film and the first trench has another height difference reflecting the height difference of the alignment mark, the height difference of the electrode layer itself can be used as the alignment mark.

In the method for the semiconductor device of the ninth aspect of the present invention, since the first trench formed in the step (b) penetrates the SOI layer in the SOI substrate, the semiconductor device can be manufactured with high accuracy in positioning on the SOI substrate.

In the method for the semiconductor device of the tenth aspect of the present invention, the interlayer insulating film is formed in the step (i), the first through hole penetrating the center portion of the first trench and the buried insulating film to reach the underlying substrate and the second through hole penetrating the interlayer insulating film to reach the control electrode are formed in the step (j) and the metal layer is formed on the interlayer insulating film including the first and second through holes in the step (k).

Therefore, in the patterning of the metal layer of the step (l), the interconnection layer can be obtained with no etching damage since the underlying substrate and the control electrode are electrically connected to each other through the first and second through holes to reduce the potential difference therebetween, and as a result a semiconductor device with excellent operation performance can be provided.

Moreover, since the deepest portion in the center portion of the first trench is formed by removing a part of the buried insulating film, formation of the first through hole penetrating the buried insulating film beneath the deepest portion becomes relatively easy.

In the method for the semiconductor device of the eleventh aspect of the present invention, since the underlying substrate is exposed in the step (f), the semiconductor elements can be formed in the underlying substrate as well as in the SOI layer of the SOI substrate by already-existing method in the later steps.

In the method for the semiconductor device of the twelfth aspect of the present invention, the element formation area includes the first circuit formation area isolated by the first circuit trench which is relatively narrow and the second circuit formation area isolated by the second circuit trench which is relatively wide.

Because of the nature that the insulating film formed on the first circuit trench which is narrow becomes thicker than that formed on the second circuit trench which is wide, it is necessary to remove the insulating film on the first circuit formation area more than that on the second circuit formation area and the step of selectively removing the insulating film on the first circuit formation area is needed.

For this reason, the resist pattern is formed on the second circuit formation area, not on the first circuit formation area in the step (d), to remove the insulating film on the first circuit formation area at one time.

In the method for the semiconductor device of the thirteenth aspect of the present invention, since the first circuit formation area of the semiconductor device manufactured by the method includes the area constituted of dynamic memory cells, it is possible to pattern the electrode layer in the dynamic memory cell with high accuracy.

In the method for the semiconductor device of the fourteenth aspect of the present invention, the insulating film is entirely removed, and the insulating film on the center portion of the first trench is all removed while that on the peripheral portion of the first trench is left as the alignment insulating film, and a part of the buried insulating film beneath the center portion of the first trench is also removed in the step (d), to obtain the height difference between the highest portion of the alignment insulating film and the bottom surface of the deepest portion of the first trench.

Therefore, since the electrode layer formed on the alignment insulating film and the first trench has another height difference reflecting the above height difference, positional detection of the alignment mark in the step (f) becomes easy with the height difference in the electrode layer and patterning of the electrode layer is achieved on the basis of the alignment mark with high accuracy.

Omitting the step of selectively removing the insulating film prior to the step (d) can simplify the manufacturing process.

In the method for the semiconductor device of the fifteenth aspect of the present invention, the element formation area includes the first circuit formation area isolated by the first circuit trench and the second circuit formation area isolated by the second circuit trench.

Since the second circuit formation area is isolated by the isolation area consisting of the plurality of second circuit trenches and the dummy layer, a wide isolation area is obtained by providing a wide dummy layer even if the second circuit trench is narrow itself.

Therefore, as the insulating films on the first circuit formation area and the second circuit formation area have the same thickness, no step of selectively removing the insulating film prior to the step (d) is needed.

In the method for the semiconductor device of the sixteenth aspect of the present invention, the interlayer insulating film is formed in the step (g), the first through hole penetrating the center portion of the first trench and the buried insulating film to reach the underlying substrate and the second through hole penetrating the interlayer insulating film to reach the control electrode are formed in the step (h) and the metal layer is formed on the interlayer insulating film including the first and second through holes in the step (i).

Therefore, in the patterning of the metal layer of the step (j), the interconnection layer can be obtained with no etching damage since the underlying substrate and the control electrode are electrically connected to each other through the first and second through holes to reduce the potential difference therebetween, and as a result a semiconductor device with excellent operation performance can be provided.

Moreover, since the deepest portion in the center portion of the first trench is formed by removing a part of the buried insulating film, formation of the first through hole penetrating the buried insulating film beneath the deepest portion becomes relatively easy.

In the method for the semiconductor device of the seventeenth aspect of the present invention, since the underlying substrate is exposed in the step (d) and the electrode layer is formed on the circuit-on-underlying-substrate area in the step (f), a semiconductor device in which the semiconductor elements can be formed on the SOI layer and the underlying substrate can be manufactured.

In the method for the semiconductor device of the eighteenth aspect of the present invention, since the first circuit formation area of the semiconductor device manufactured by the method includes the area constituted of dynamic memory cells, it is possible to pattern the electrode layer in the dynamic memory cell with high accuracy.

An object of the present invention is to provide a semiconductor device with trench isolation structure which allows an alignment with high accuracy, without deterioration of device performance, and a method for manufacturing the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 8 are cross sections showing steps in a method for manufacturing a semiconductor device in accordance with a first preferred embodiment of the present invention;

DESCRIPTION OF THE PREFERRED EMBODIMENTS

<Trial Example>

It seems that the problem in the background art is caused by formation of the resist pattern on the trench in the alignment mark area when the preetching is performed. Then proposed is a method where no resist pattern is formed on the alignment mark area 11A as shown in FIGS. 39 to 43.

Figure 39:
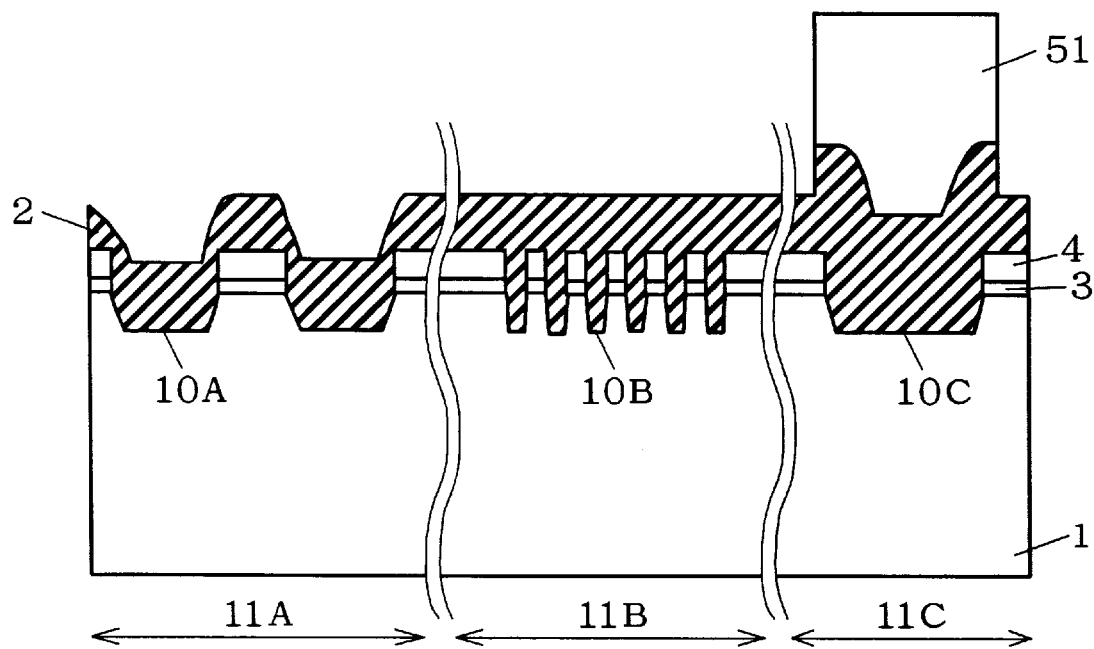

As shown in FIG. 39, to reduce the thickness difference of silicon oxide film on trench, a resist pattern 51 is formed only on the trench 10C by photolithography and a predetermined portion of the silicon oxide film 2 is removed from its front surface side by dry etching. Thus, in the step of FIG. 39, the silicon oxide film 2 on the trenches 10B and that on the trenches 10A are removed at one time.

Figure 40:
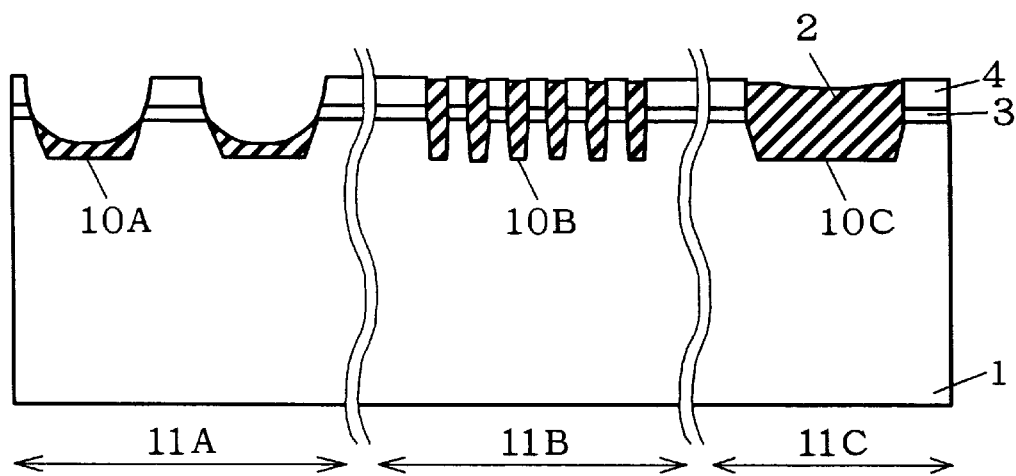

Subsequently, as shown in FIG. 40, the resist pattern 51 is removed and then the silicon oxide film 2 on the silicon nitride film 4 and part of the silicon oxide film 2 on the trenches 10A to 10C are removed by CMP. In this case, the silicon oxide films 2 on the trenches 10A in the alignment mark area 11A are thinner than those on the trenches 10B and 10C in the element formation area before the CMP polishing, and so are they after the CMP polishing.

Figure 41:
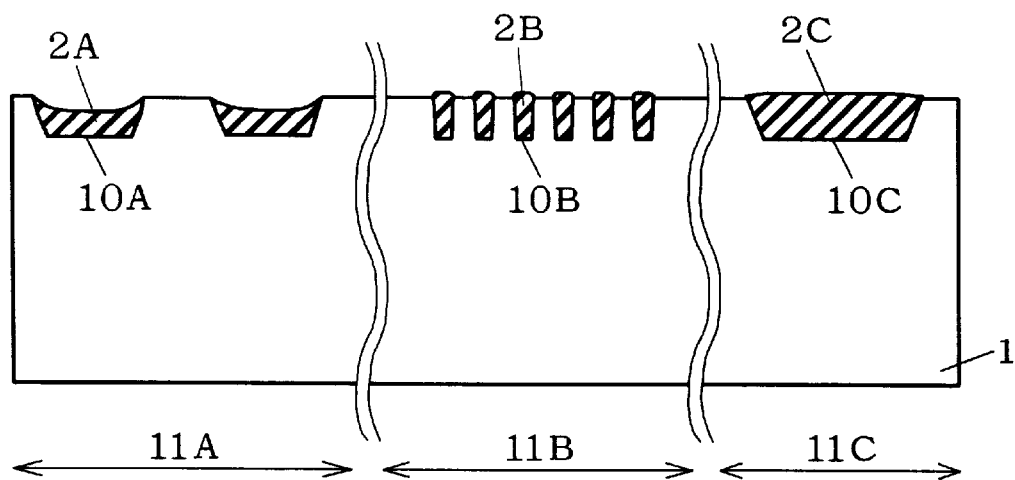

Next, as shown in FIG. 41, the silicon nitride film 4 is removed with phosphoric acid and the silicon oxide film 3 and the part of the silicon oxide film 2 are removed with hydrofluoric acid, to form the buried silicon film 2A in the alignment mark area 11A, the buried silicon film 2B in the memory cell area 11B and the buried silicon film 2C in the peripheral circuit area 11C which constitute the trench isolation structure. At this time, the center portion of the buried silicon oxide film 2A on the trench 10A in the alignment mark area 11A is some lower than the surface of the silicon substrate 1 while the surfaces of the buried oxide films 2B and 2C in the element formation areas 11B and 11C are almost even with the surface of the silicon substrate 1.

Figure 42:
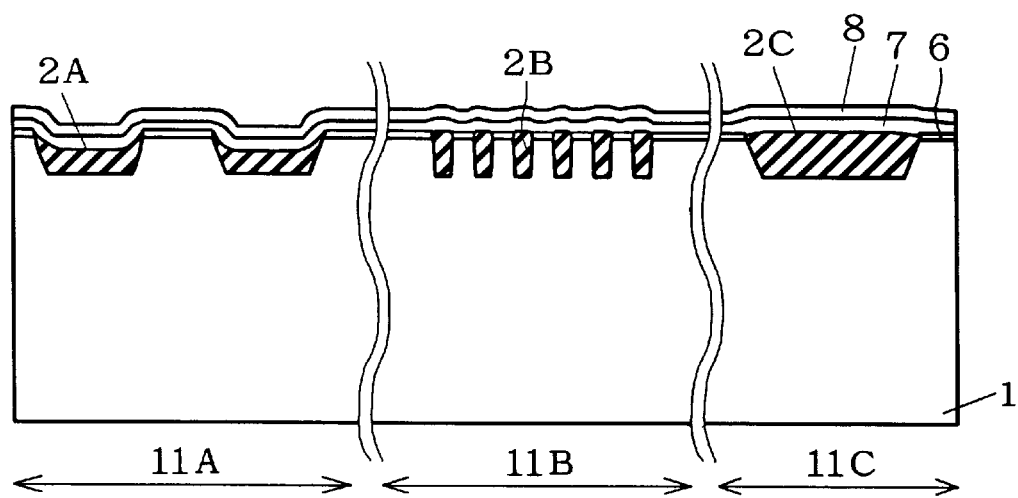

Subsequently, as shown in FIG. 42, the gate oxide film 6 is formed by thermal oxidation and the polysilicon film 7 doped with phosphorus and the tungsten silicide film 8 are formed on the gate oxide film 6 in this order.

Figure 43:
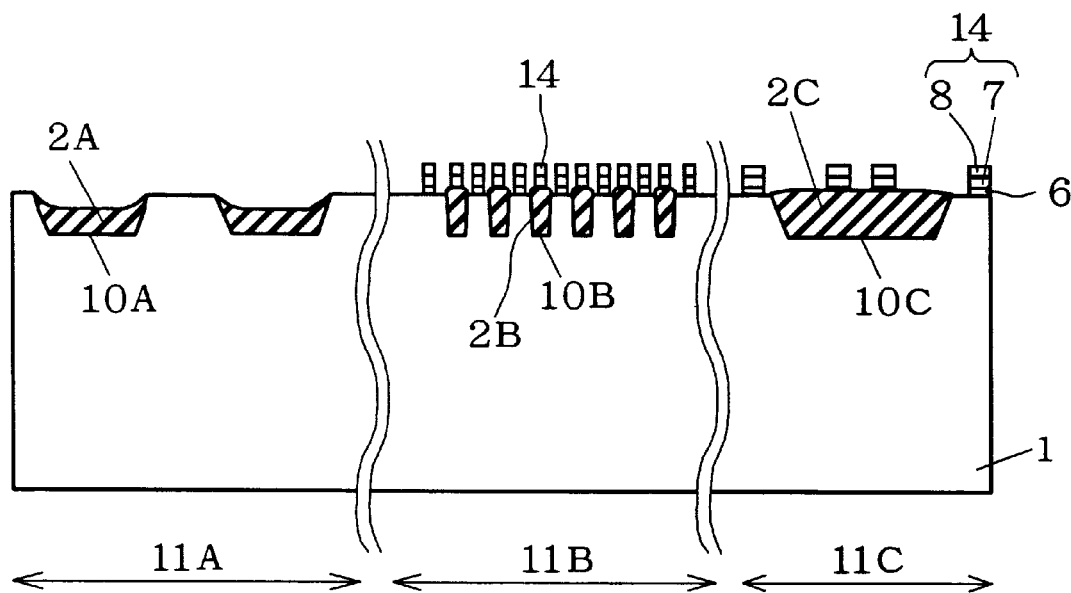
Figure 44:
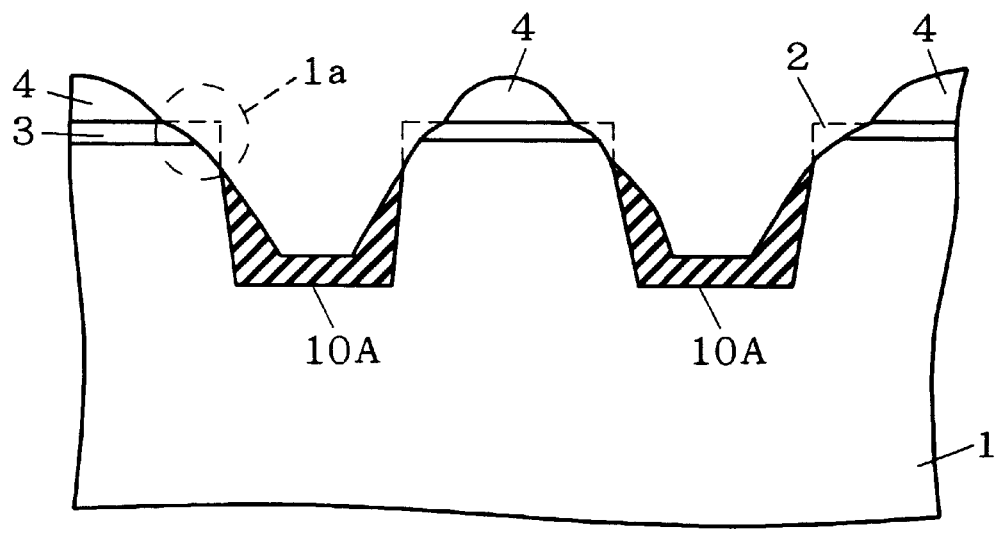
FIG. 44 is a cross section showing a problem of a semiconductor device in the trial example.
Figure 45:
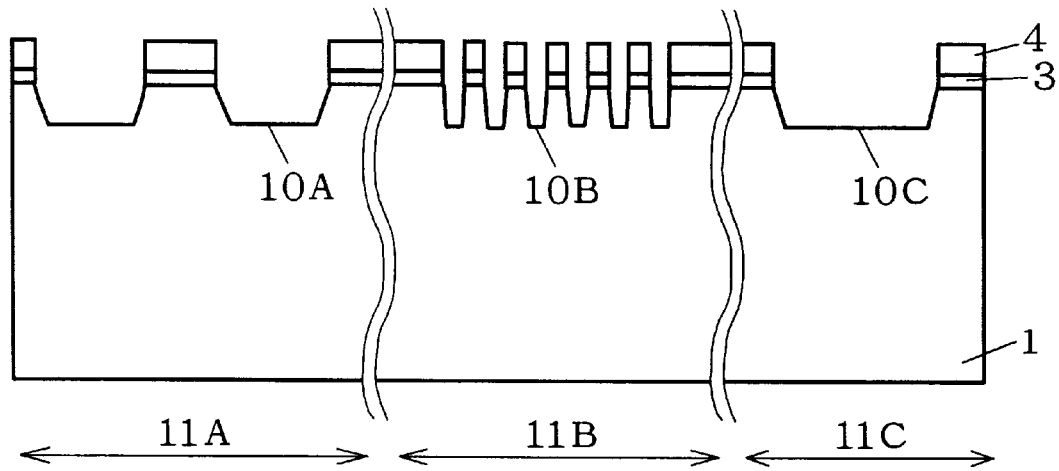
FIGS. 45 to 51 are cross sections showing steps in a method for manufacturing the semiconductor device in the background art.
Figure 46:
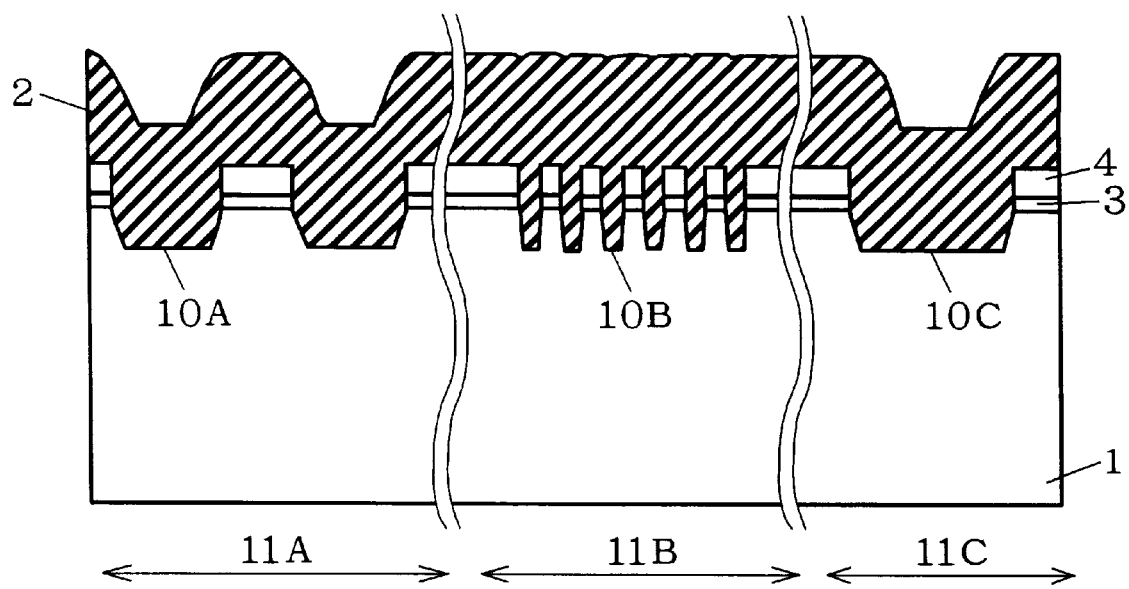
Figure 47:
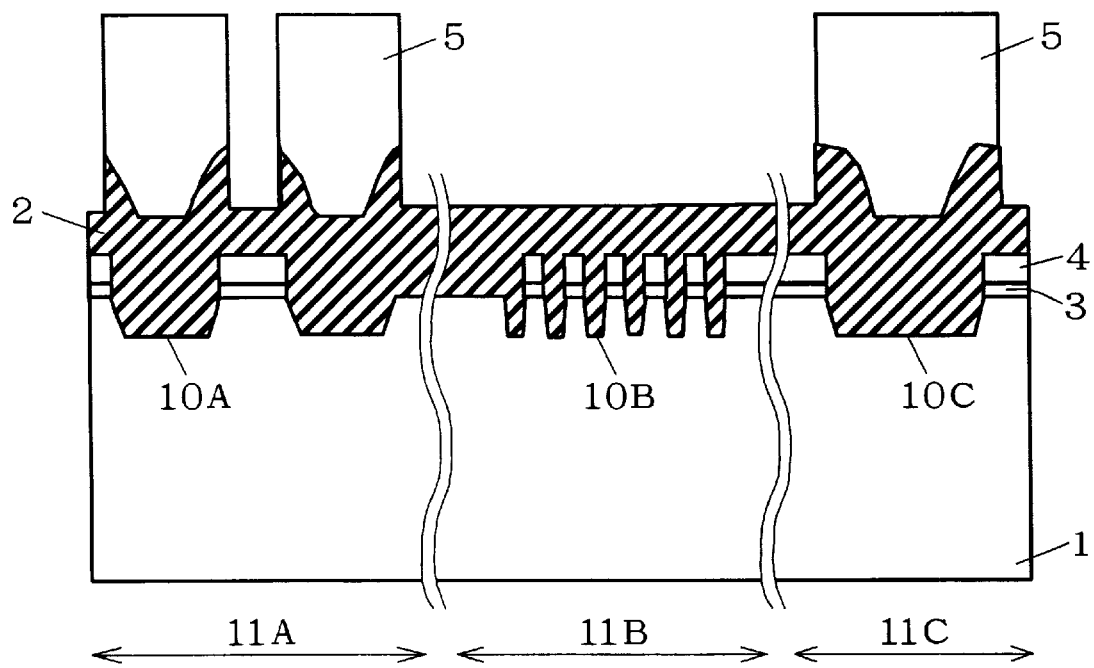
Figure 48:
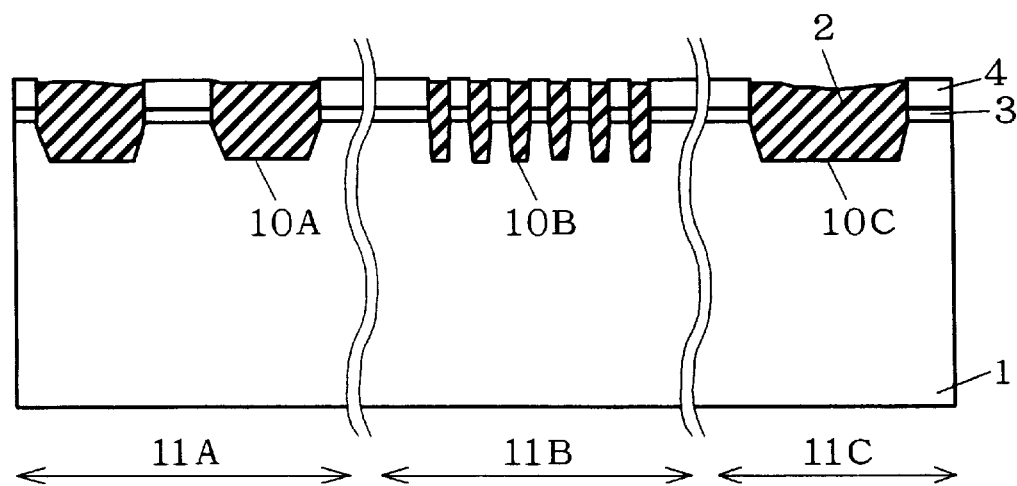
Figure 49:
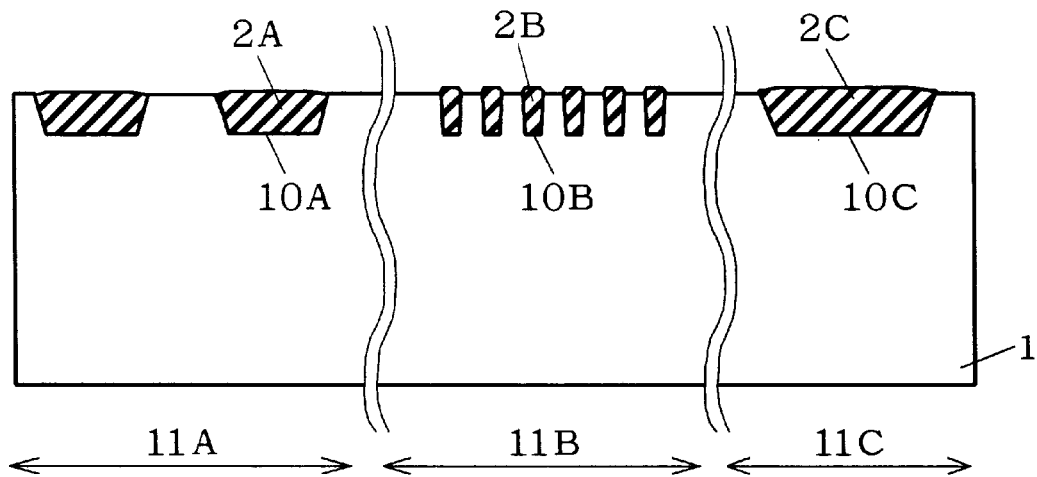
Figure 50:
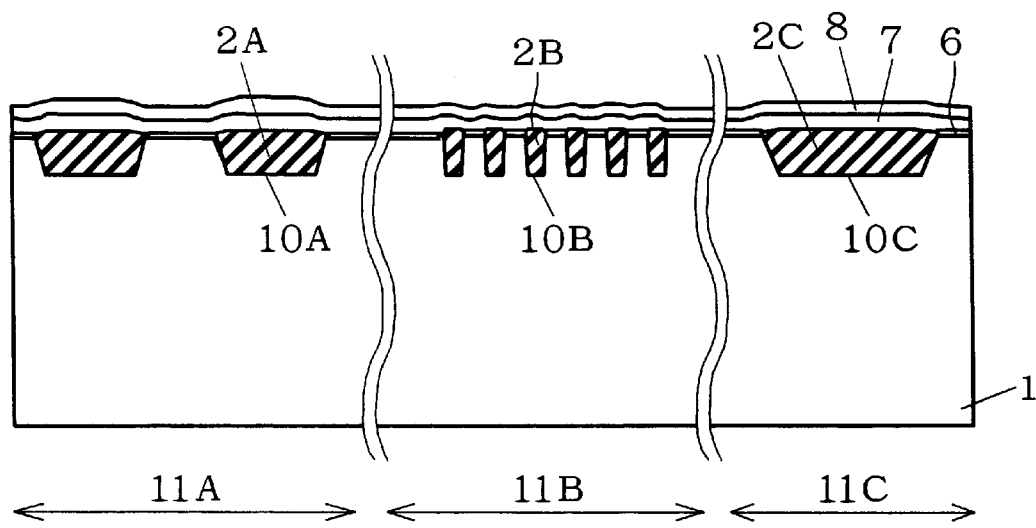
Figure 51:
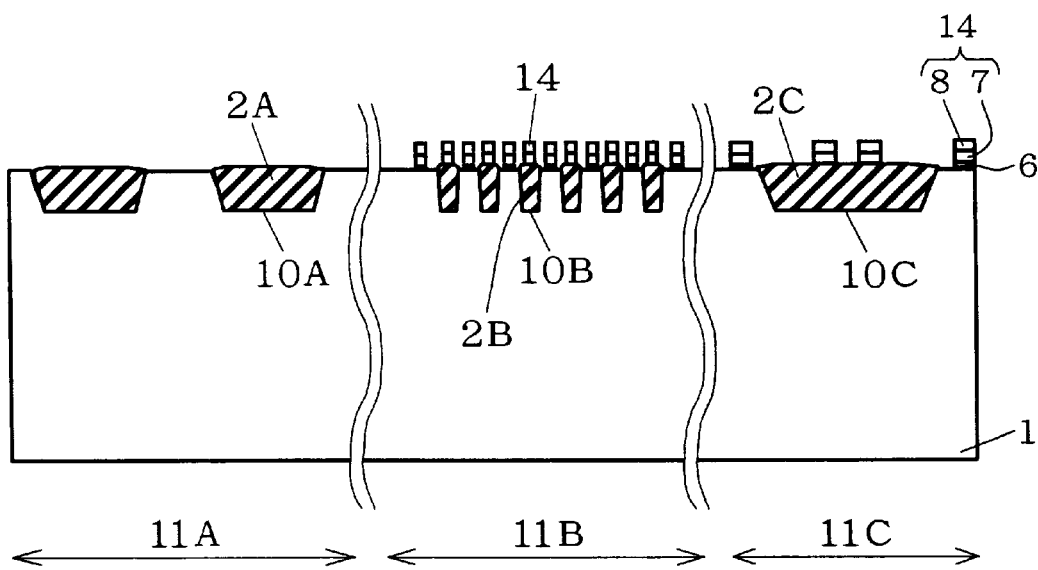

Next, with the alignment mark (the buried silicon oxide film 2A) which is formed in the step of forming the isolation structure, an alignment of the gate mask for forming a gate electrode is performed in the isolation region by photolithography, and the gate electrodes 14 are formed through partially removing part of the tungsten silicide film 8 and the polysilicon film 7 by dry etching, as shown in FIG. 43.

In the above method, however, the silicon oxide film 2 in the vicinity of the trenches 10A becomes thinner before polishing since the silicon oxide film 2 corresponding to the trenches 10A in the alignment mark area 11A is preetched. The speed of CMP polishing becomes high because the trenches 10A are relatively wide.

Therefore, if the CMP polishing is performed in accordance with the etching of the silicon oxide film 2 in the memory cell area 11B, all the silicon oxide films 2 in the alignment mark area 11A except those on the trenches 10A are etched and the silicon oxide film 3 and the silicon nitride film 4 therebeneath are etched, and further a fringe portion 1a of the trench 10A in the silicon substrate 1 (a corner of the trench 10A and the surface of the silicon substrate 1) is removed, being rounded.

As a result, the detection accuracy of the fringe portion of the trench 10A is deteriorated, to leave the problem of low accuracy for superimposition of the gate masks unsolved. Thus, the method of no preetching in the alignment mark area 11A can not produce so great effect as expected.

The present invention is intended to enhance the accuracy for superimposition of the gate masks, considering that the accuracy for superimposition of the gate masks is deteriorated both in cases of forming the resist pattern on the trenches in the alignment mark area for preetching (background art) and of forming no resist pattern in the alignment mark area (trial example).

<The First Preferred Embodiment>

FIGS. 1 to 8 are cross sections showing steps in a method for manufacturing a semiconductor device (DRAM) with trench isolation structure in accordance with the first preferred embodiment of the present invention. With reference to these figures, the manufacturing method will be discussed below.

First, the silicon oxide film 3 is formed on the bulk silicon substrate 1 to have a thickness of 100 to 500 Å. The silicon oxide film 3 may be formed through deposition by thermal oxidation (at the temperature of 700 to 1100° C.), CVD (at the temperature of 600 to 850° C.) or the like. Then, the silicon nitride 4 is formed by CVD (at the temperature of 600 to 850° C.), to have a thickness of 1000 to 4000 Å, on the silicon oxide film 3.

With the field mask, a not-shown resist is patterned, and further with the resist mask, the silicon oxide film 3 and the silicon nitride film 4 are etched. The silicon substrate 1 is selectively removed by dry etching by 1000 to 5000 Å, to form the trenches 10 (10A to 10C) in the silicon substrate 1. After that, to recover from an etching damage, an annealing may be performed at the temperature of 600 to 1200° C. or the silicon substrate 1 may be oxidized by heat treatment at the temperature of 700 to 1200° C. by about 100 to 500 Å.

Through the above steps, the relatively wide trenches 10A are formed in the alignment mark area 11A, the narrow trenches 10B are formed in the memory cell area 11B and the wide trenches 10C are formed in the peripheral circuit area 11C. Thus, the trenches 10A and 10C in the alignment mark area 11A and the peripheral circuit area 11C are formed in a loose pattern and the trenches 10B in the memory cell 11B are formed in a dense pattern.

Subsequently, as shown in FIG. 2, the silicon oxide film 2 is deposited by CVD on the whole surface of the silicon substrate 1 including the trenches 10A to 10C, to bury the silicon oxide film 2 into the trenches 10A to 10C. While the silicon oxide film 2 on the wide trenches 10A and 10C is as thick as the deposited film, the silicon oxide film 2 on the narrow trench 10B is thicker than the deposited film since the insulating film is buried into the narrow trenches at the early stage of deposition. The silicon oxide 3 in which the trenches are formed may be an insulating film formed by any method. For example, it may be a CVD oxide film which is formed in high-density plasma atmosphere.

Figure 3:
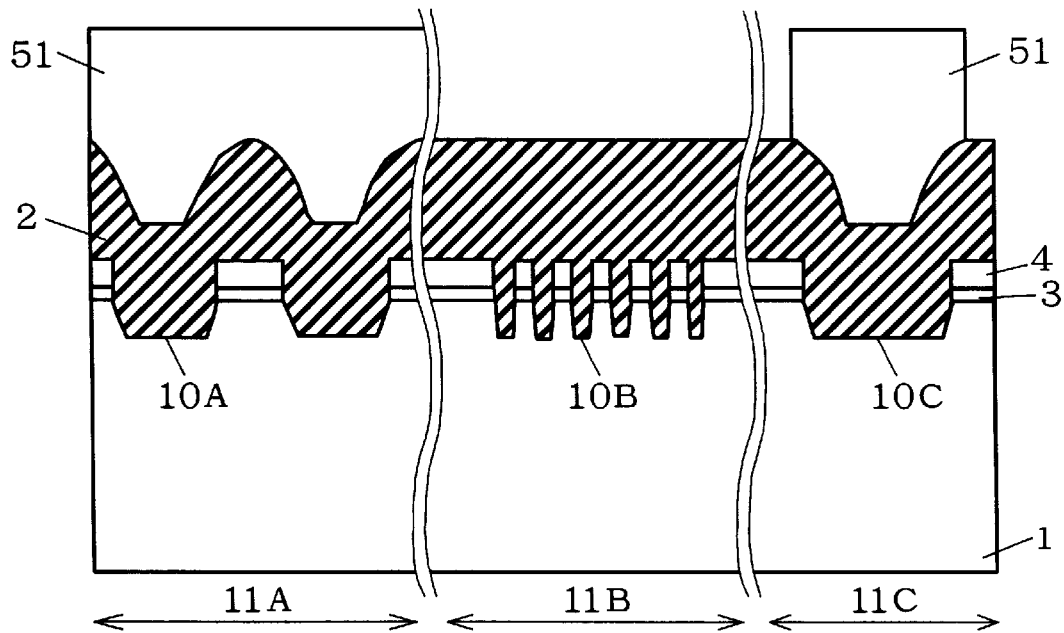

Next, as shown in FIG. 3, to reduce the thickness difference of silicon oxide film on trench, the resist pattern 51 is formed with a preetching mask only on the buried silicon oxide films 2 on the whole surface of the alignment mark area 11A and on the trench 10C.

Figure 4:
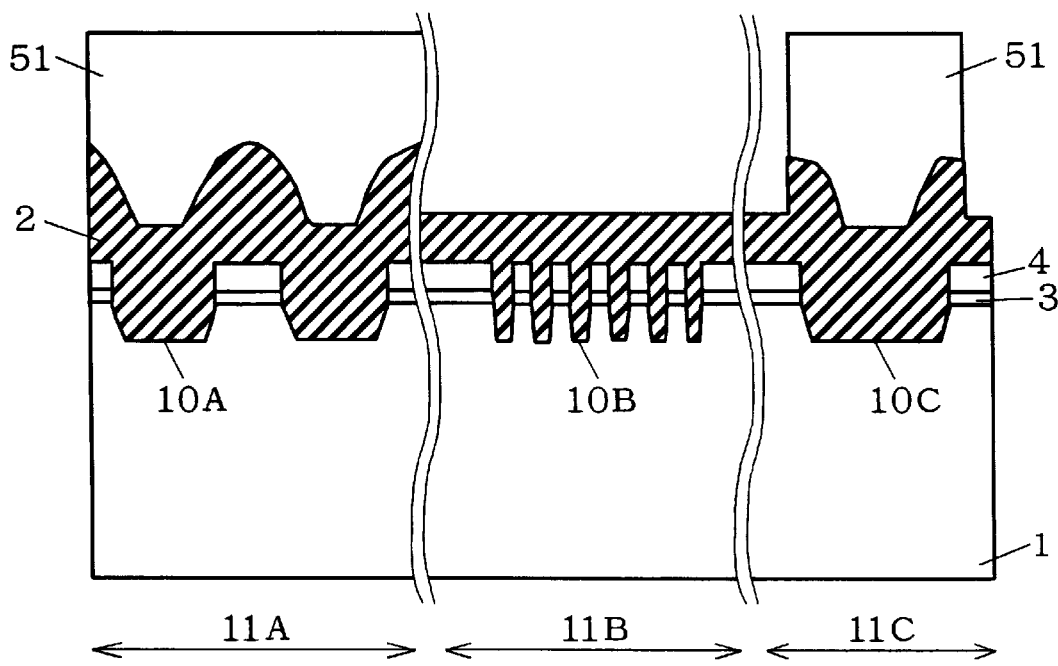

A preetching is performed by dry etching, to remove the silicon oxide films 2 on the whole surface of the memory cell area 11B and part of the peripheral circuit area 11C by a predetermined thickness as shown in FIG. 4. Since the alignment mark area 11A is entirely covered with the resist pattern 51 when the preetching is performed, the difference in height between the silicon oxide films 2 on the trenches 10A and that on other portions is maintained even after the preetching.

Figure 5:
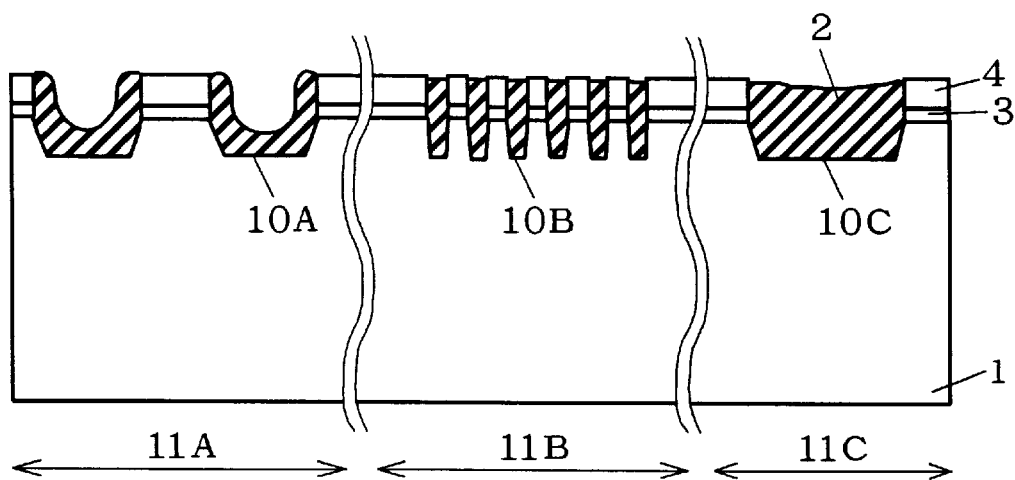

Subsequently, as shown in FIG. 5, the resist pattern 51 is removed and then the silicon oxide film 2 on the silicon nitride film 4, part of the silicon oxide films 2 on the trenches 10A to 10C and part of the silicon nitride film 4 are removed through entirely polishing by CMP. At this time, the silicon nitride film 4 on the alignment mark area 11A is slightly thicker than those on other portions.

Figure 6:
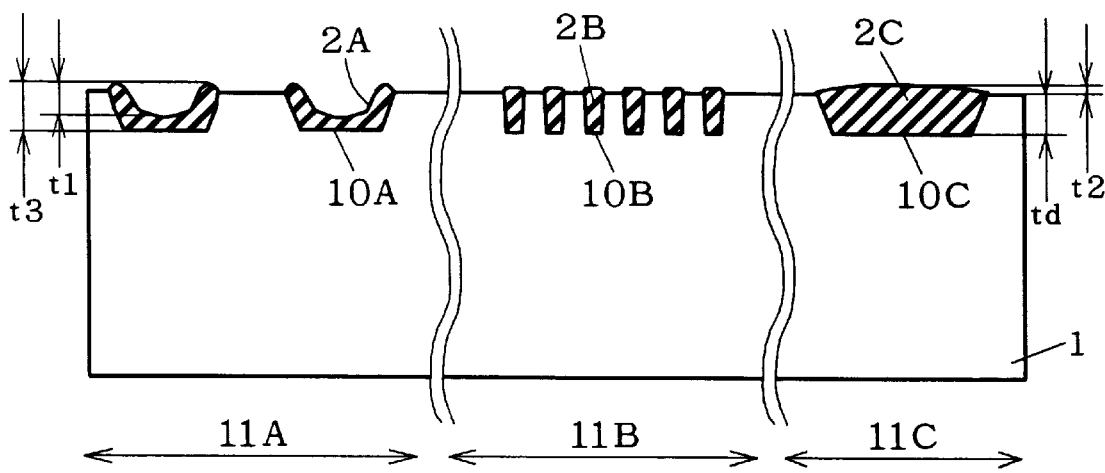

Next, as shown in FIG. 6, the silicon nitride film 4 is removed with phosphoric acid and the silicon oxide film 3 and the part of the silicon oxide film 2 are removed with hydrofluoric acid, to form the buried silicon film 2A in the alignment mark area 11A, the buried silicon film 2B in the memory cell area 11B and the buried silicon film 2C in the peripheral circuit area 11C which constitute the trench isolation structure.

Figure 7:
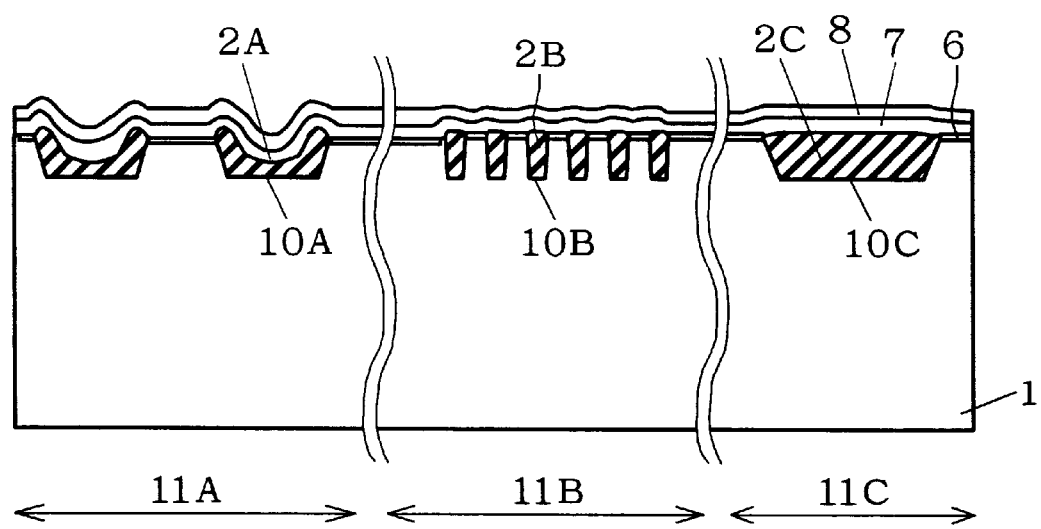

After forming a channel region, as shown in FIG. 7, the gate oxide film 6 is formed by thermal oxidation and the like and the polysilicon film 7 doped with phosphorus and the tungsten silicide film 8 are formed on the gate oxide film 6 in this order. The gate oxide film 6 may be formed so as to contain some nitrogen in a nitrogen atmosphere.

Figure 8:
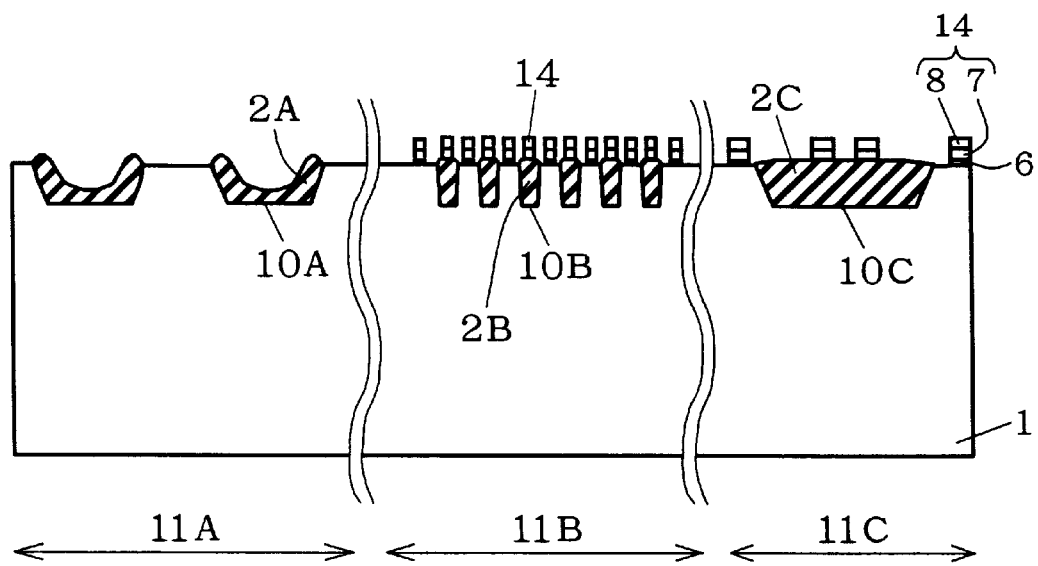

Next, as shown in FIG. 8, with the buried silicon oxide film 2A (alignment mark) which is formed in the step of forming the isolation structure in the alignment mark area 11A, the pattern for superimposing the gate electrode in the isolation region is formed by photolithography, and the gate electrodes 14 are formed in the memory cell area 11B and the peripheral circuit area 11C through partially removing the tungsten silicide film 8 and the polysilicon film 7 by dry etching. The gate electrodes 14 controls an operation of a semiconductor element, such as a transistor, which is manufactured in a later already-existing process.

Figure 9:
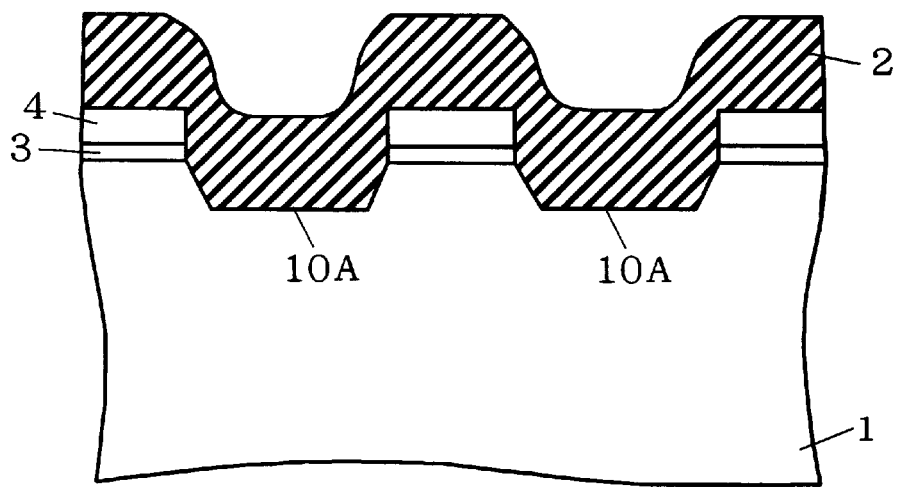
FIGS. 9 to 11 are cross sections showing a characteristic feature in structure of the semiconductor device in accordance with the first preferred embodiment of the present invention.
Figure 10:
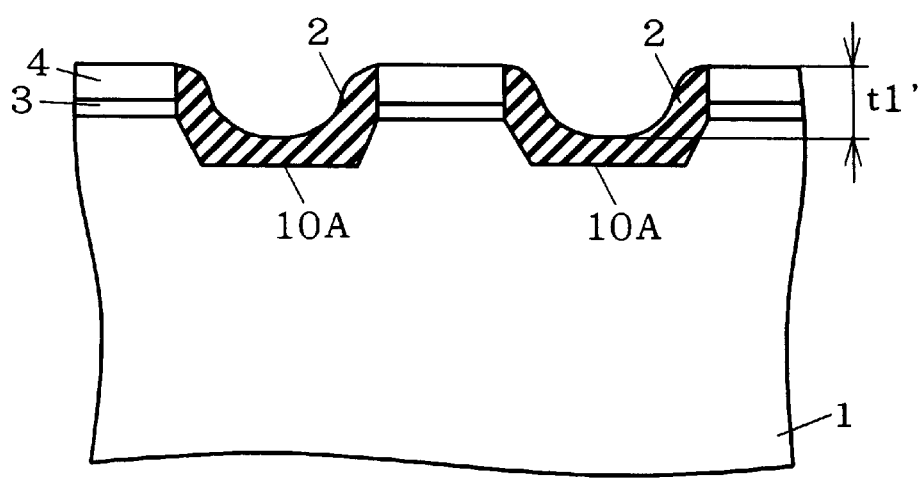

FIGS. 9 and 10 are detailed illustrations of the alignment mark area 11A. FIG. 9 illustrates a state before polishing the deposited silicon oxide film 2 by CMP while FIG. 10 illustrates a state after CMP polishing. As shown in these figures, since the silicon oxide film 2 on the fringe portion of the trench 10A before the polishing is sufficiently thick, even if the etching is performed under the condition optimum for the trench 10B in the memory cell area 11B, the silicon substrate 1 at the fringe portion of the trench 10A is not removed in the CMP polishing and a height difference t1' is obtained, where the highest portion of the silicon oxide film 2 at the peripheral portion in the trench 10A is almost even with the surface of the silicon nitride film 4 and the lowest portion of the silicon oxide film 2 at the center portion in the trench 10A is lower than the surface of the silicon nitride film 4.

Figure 11:
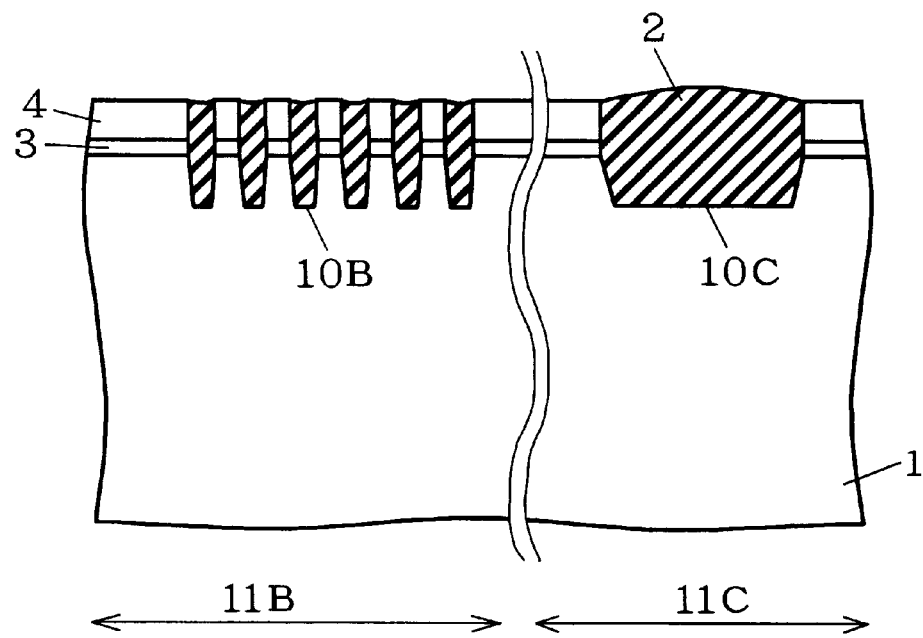

On the other hand, as shown in FIG. 11, the silicon oxide films 2 on the trenches 10B and 10C in the memory cell area 11B and the peripheral circuit area 11C are almost even with the surface of the silicon nitride film 4, having little height difference.

Moreover, in the first preferred embodiment, since the resist pattern 51 is formed on the whole surface of the alignment mark area 11A, the silicon nitride film 4 on the alignment mark area 11A is left thicker than those on other areas.

Therefore, as shown in FIG. 6, after removing the silicon oxide film 3 and the silicon nitride film 4, the highest portion of the silicon oxide film 2A formed in the peripheral portion of the trench 10A protrudes from the surface of the silicon substrate 1 and a height difference t1 is obtained, where the surface of the silicon oxide film 2A at the center portion on the trench 10A is lower than the surface of the silicon substrate 1.

In comparison of the height difference t1 of the silicon oxide film 2A in the alignment mark area 11A with the height difference t2 of the remainder film in the element formation area (the memory cell area 11B and the peripheral circuit area 11C) (see FIG. 6), it is clear that a relation t1>t2 is hold. In other words, it is possible to increase the height difference of the silicon oxide film 2A, without any problem in the trial example, in the semiconductor device of the first preferred embodiment.

Moreover, since the silicon oxide film 2A at the fringe portion of the trench 10A protrudes from the surface of the silicon substrate 1, in comparison of the height t3 of the silicon oxide film 2A on the trench 10A from its bottom with the depth td of each of the trenches 10A to 10C, a relation t3>td is hold.

In the semiconductor device of the first preferred embodiment, the alignment mark (the buried silicon oxide film 2A) has a height difference to the extent that the relations t1>t2 and t3>td are hold, and therefore, even when the gate electrode material is formed thereon, the gate electrode material reflects the height difference of the buried silicon oxide film 2A.

As a result, in the patterning of the gate electrode, with easy detection of the alignment mark using the height difference of the gate electrode material, a resist pattern is formed through accurate superimposition of the gate mask, whereby the gate electrode can be patterned with high accuracy.

<The Second Preferred Embodiment>

FIGS. 12 to 17 are cross sections showing steps in a method for manufacturing a semiconductor device with trench isolation structure in accordance with the second preferred embodiment of the present invention. With reference to these figures, the manufacturing method will be discussed below.

Figure 12:
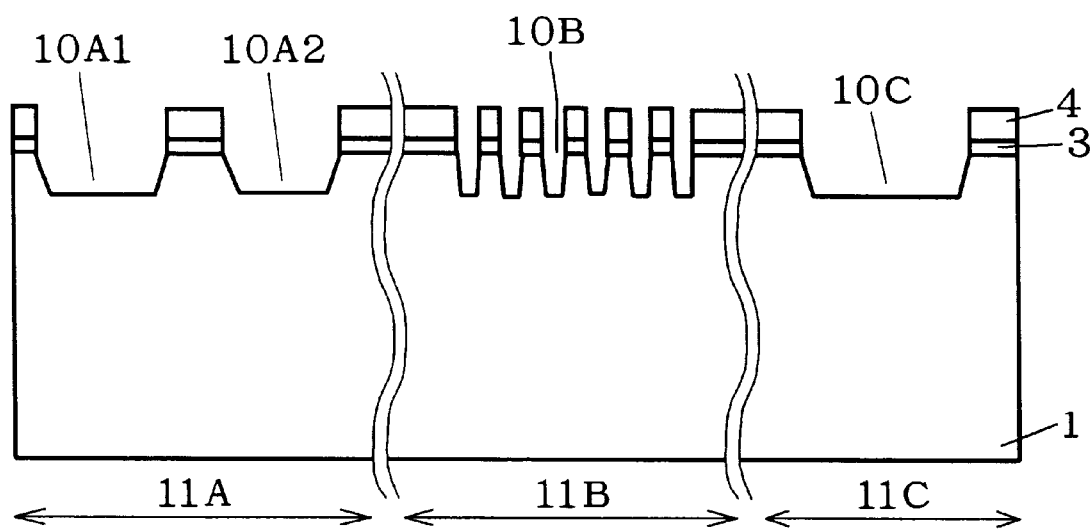
FIGS. 12 to 17 are cross sections showing steps in a method for manufacturing a semiconductor device in accordance with a second preferred embodiment of the present invention.

First, like in the first preferred embodiment, the silicon oxide film 3 is formed on the (bulk) silicon substrate 1 to have a thickness of 100 to 500 Å, and the silicon nitride 4 is formed, to have a thickness of 1000 to 4000 Å, on the silicon oxide film 3. The silicon substrate 1 is selectively removed by dry etching by 1000 to 5000 Å, to form the trenches 10 (10A to 10C) in the silicon substrate 1, as shown in FIG. 12.

Through the above steps, the relatively wide trenches 10A (10A1, 10A2) are formed in the alignment mark area 11A, the narrow trenches 10B are formed in the memory cell area 11B and the wide trenches 10C are formed in the peripheral circuit area 11C. Further, in the alignment mark area 11A, the trench 10A1 is wider than the trench 10A2.

Figure 13:
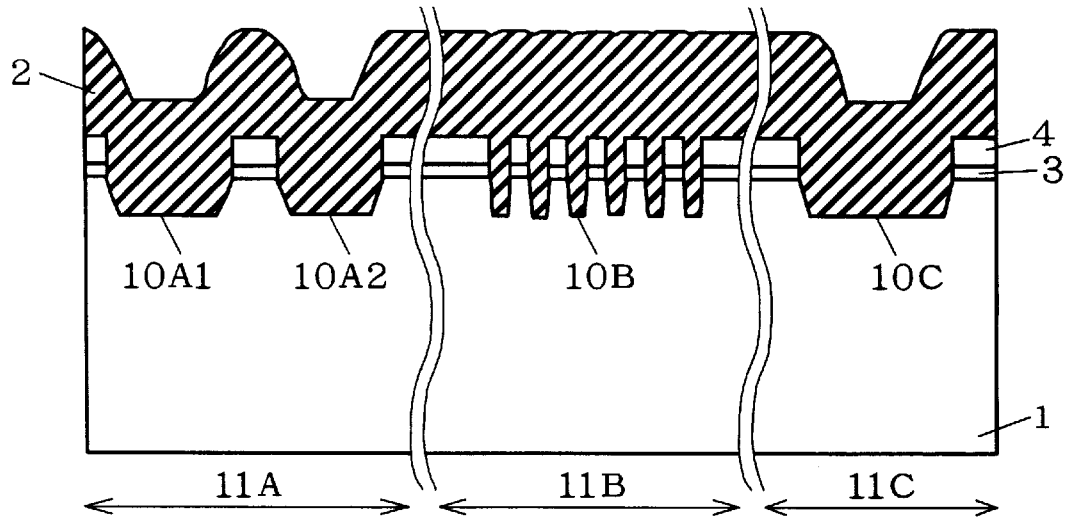

Subsequently, as shown in FIG. 13, the silicon oxide film 2 is deposited on the whole surface of the silicon substrate 1 to bury the silicon oxide film 2 into the trenches 10A to 10C.

Figure 14:
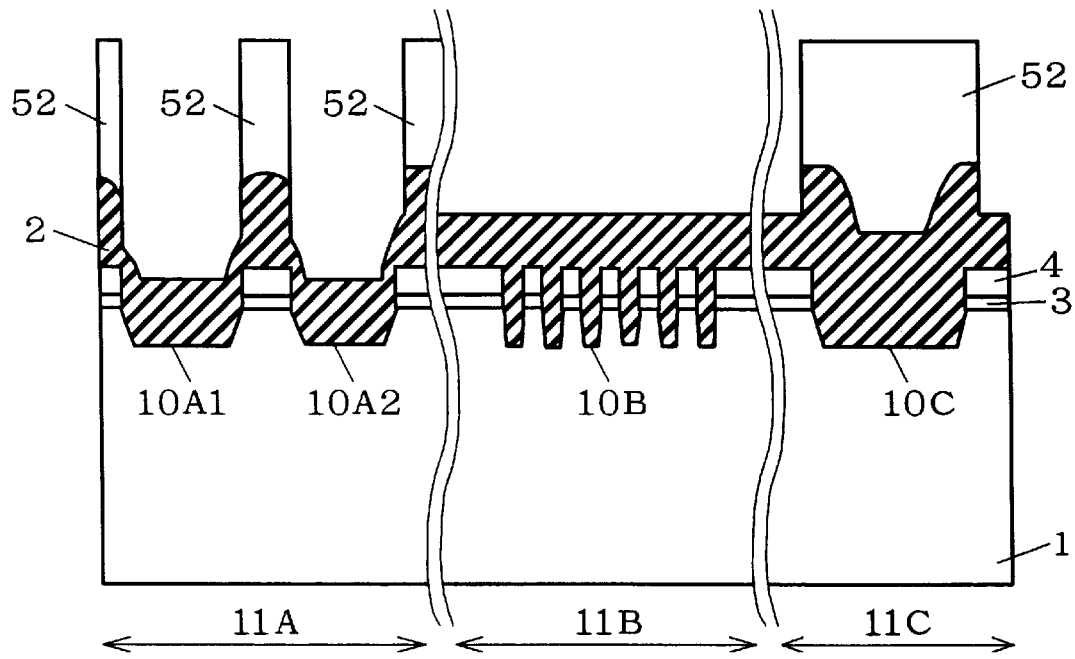

Next, as shown in FIG. 14, to reduce the thickness difference of silicon oxide film on trench, the resist pattern 52 is formed with the preetching mask on convex portions of the silicon oxide film 2 (the silicon oxide film 2 in the vicinity region of the peripheral portions of the trenches 10A (10A1, 10A2)) and on the buried silicon oxide film 2 on the trench 10C, and the preetching is performed by dry etching, to remove the silicon oxide film 2 on the whole surface of the memory cell area 11B and part of the alignment mark area 11A and the peripheral circuit area 11C.

As a result, since the convex portions of the silicon oxide film 2 in the alignment mark area 11A are entirely covered with the resist pattern 52, the difference in height between the silicon oxide films 2 on the trenches 10A in the alignment mark area 11A and those in other areas further increases after the preetching.

Figure 15:
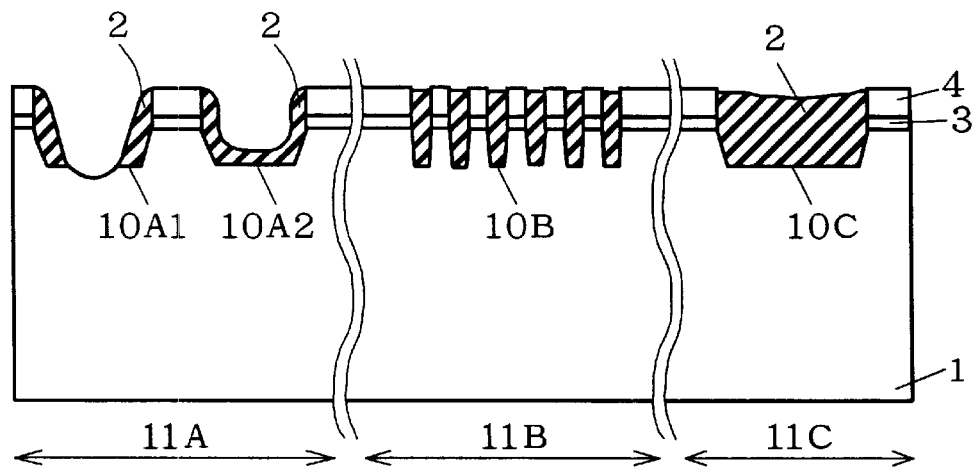

Subsequently, as shown in FIG. 15, the resist pattern 52 is removed and then the silicon oxide film 2 on the silicon nitride film 4, part of the silicon oxide films 2 on the trenches 10A to 10C and part of the silicon nitride film 4 are removed through entirely polishing by CMP.

At this time, the silicon oxide film 2 on the center portion of the trench 10A1 which is wider than the trench 10A2 is all removed by dishing effect that a center portion is more removed in a wide trench and further part of the silicon substrate 1 beneath the bottom surface of the center portion of the trench 10A1 is removed. As a result, the trench 10A1 has the deepest portion which is deeper than those of the trenches 10B and 10C. Furthermore, the silicon nitride film 4 on the alignment mark area 11A is slightly thicker than those on other portions.

Figure 16:
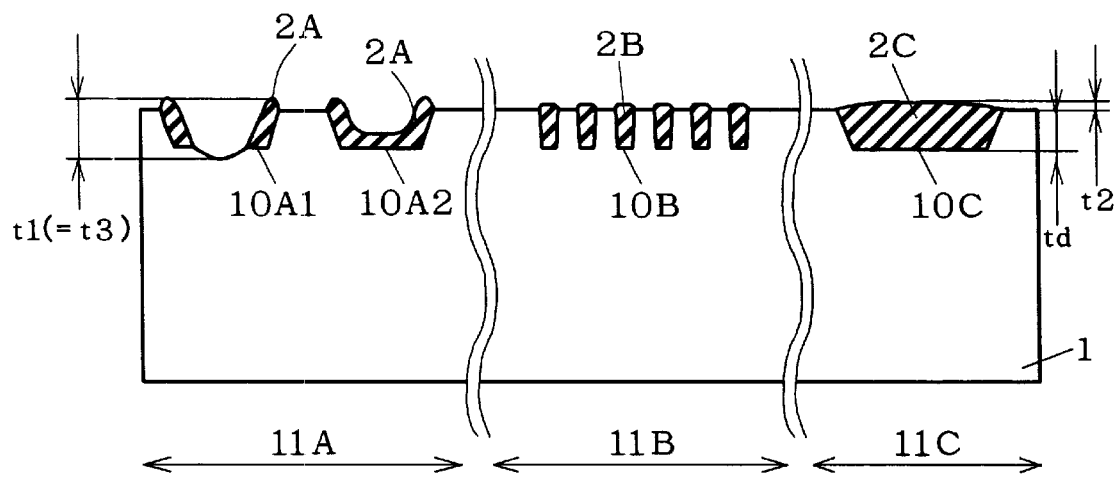

Next, as shown in FIG. 16, the silicon nitride film 4 is removed with phosphoric acid and the silicon oxide film 3 and the part of the silicon oxide film 2 are removed with hydrofluoric acid, to form the buried silicon film 2A in the alignment mark area 11A, the buried silicon film 2B in the memory cell area 11B and the buried silicon film 2C in the peripheral circuit area 11C which constitute the trench isolation structure.

Figure 17:
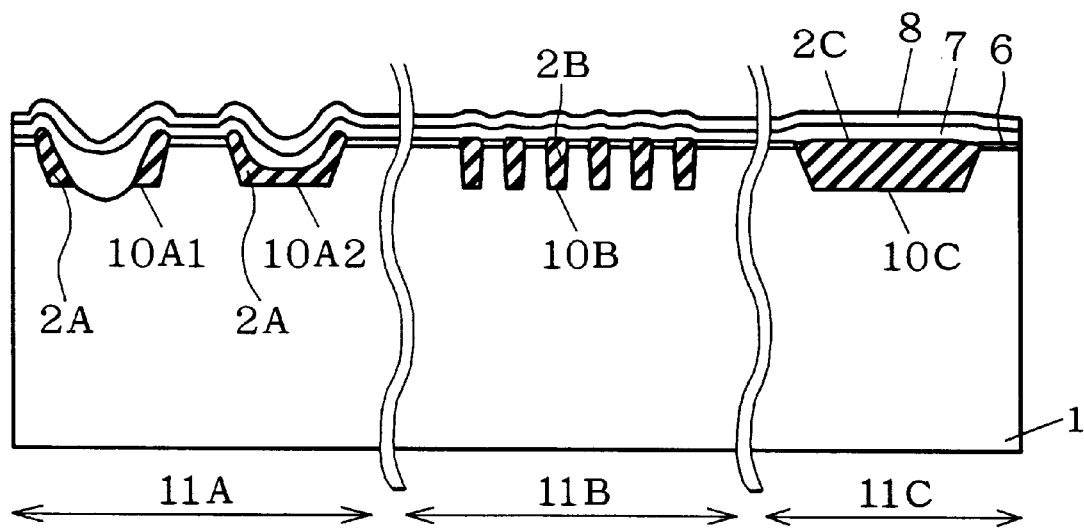

Subsequently, like in the first preferred embodiment, as shown in FIG. 17, the gate oxide film 6 is formed and the polysilicon film 7 doped with phosphorus and the tungsten silicide film 8 are formed on the gate oxide film 6 in this order.

Next, with the alignment mark (the buried silicon oxide film 2A (+the trench 10A1)) of the second preferred embodiment which is formed in the step of forming the isolation structure in the alignment mark area 11A, the pattern for superimposing the gate electrode in the isolation region is formed by photolithography, and the gate electrodes are formed in the memory cell area 11B and the peripheral circuit area 11C through partially removing the tungsten silicide film 8 and the polysilicon film 7 by dry etching.

Figure 18:
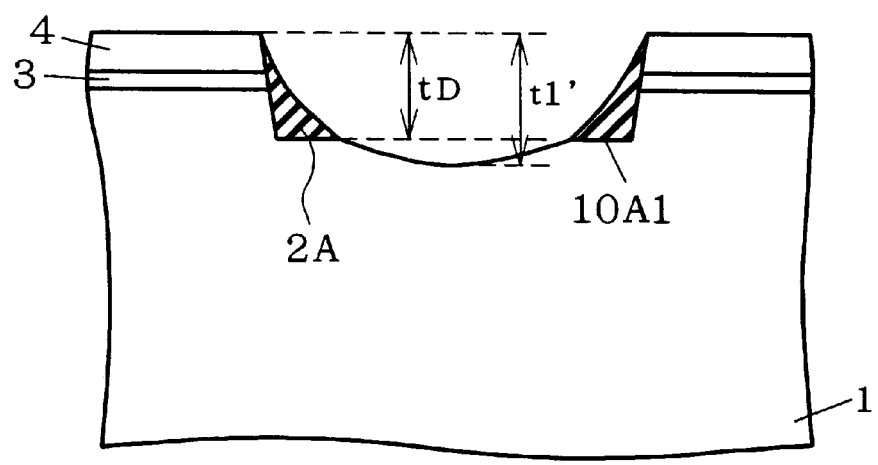
FIG. 18 is a cross section showing a characteristic feature in structure of the semiconductor device in accordance with the second preferred embodiment of the present invention.

FIG. 18 is a detailed illustration of the alignment mark area 11A. As shown in this figure, the silicon substrate 1 at the fringe portions of the trenches 10A1 and 10A2 is not removed even if the etching is performed under the condition optimum for the trench 10B in the memory cell area 11B in the CMP polishing. A height difference t1' is obtained, where the highest portion (the peripheral portion of the trench 10A1) is almost even with the surface of the silicon nitride film 4 and the lowest portion (the center portion of the trench 10A1) becomes deeper than the initial depth tD of the trench 10A1.

Therefore, as shown in FIG. 16, after removing the silicon oxide film 3 and the silicon nitride film 4, the highest portion of the silicon oxide film 2A protrudes from the surface of the silicon substrate 1 and a height difference t1 is obtained, where the deepest portion in the center portion of the trench 10A1 is deeper than the initial depth of the trench 10A1.

In comparison of the height difference t1 of the alignment mark (the silicon oxide film 2A+the trench 10A1) in the alignment mark area 11A with the height difference t2 of the remainder film in the element formation area (the memory cell area 11B and the peripheral circuit area 11C) (see FIG. 7), it is clear that a relation t1>t2 is hold.

Moreover, since the silicon oxide films 2 at the fringe portions of the trenches 10A1 and 10A2 are sufficiently thick before the CMP polishing (see FIG. 14), the silicon substrate 1 at the fringe portions of the trenches 10A1 and 10A2 is not removed even if the etching is performed under the condition optimum for the trench 10B in the memory cell area 11B in the CMP polishing.

Furthermore, since the deepest portion of the trench 10A1 is made by partially removing the silicon substrate 1, in comparison of the height of the silicon film 2A t3 (=t1) from the bottom of the trench 10A1 with the depth td of each of the trenches 10B and 10C, a relation t3>td is hold.

In the semiconductor device of the second preferred embodiment, the alignment mark (the buried silicon oxide film 2A (+the trench 10A1)) has a height difference to the extent that the relations t1>t2 and t3 (=t1)>td are hold, and therefore, even when the gate electrode material is formed thereon, the gate electrode material reflects the height difference of the buried silicon oxide film 2A.

As a result, in the patterning of the gate electrode, with easy detection of the alignment mark using the height difference of the gate electrode material, a resist pattern is formed through accurate superimposition of the gate mask, whereby the gate electrode can be patterned with high accuracy.

<The Third Preferred Embodiment>

FIGS. 19 to 24 are cross sections showing steps in a method for manufacturing a semiconductor device with trench isolation structure in accordance with the third preferred embodiment of the present invention. With reference to these figures, the manufacturing method will be discussed below. The characteristic feature of the third preferred embodiment is lied in use of an SOI substrate consisting of an underlying substrate 21, a buried oxide film 22 and an SOI layer 23, instead of the silicon substrate 1 used in the second preferred embodiment. This preferred embodiment may use an SOI substrate manufactured by any method, such as an SIMOX substrate manufactured by oxygen injection and a bonding substrate.

First, the silicon oxide film 3 is formed by CVD (at the temperature of about 800° C.) on the SOI layer 23 or by thermal oxidation of the SOI layer 23 (at the temperature of about 800° C.), to have a thickness of about 100 to 300 Å, and the silicon nitride film 4 is formed by CVD (at the temperature of about 700° C.) on the silicon oxide film 3 to have a thickness of 1000 to 4000 Å.

Figure 19:
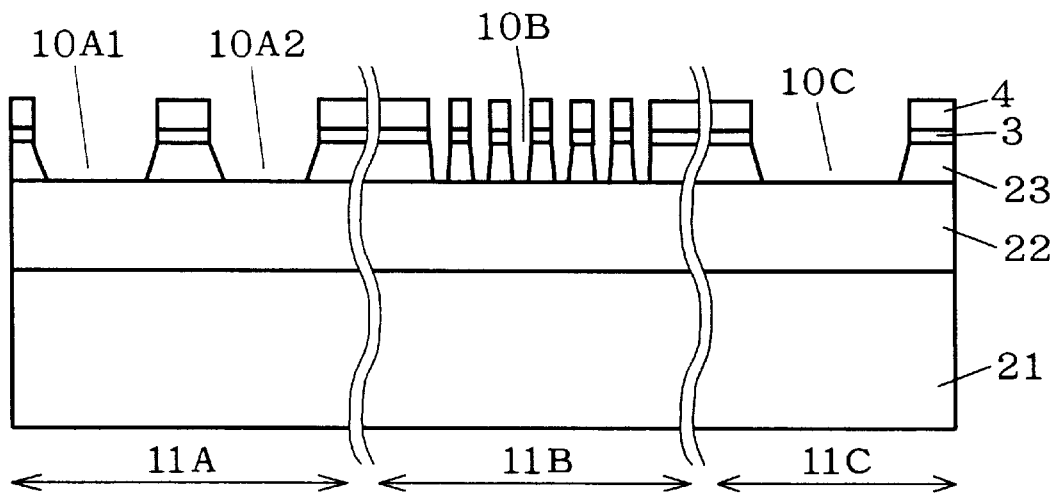
FIGS. 19 to 24 are cross sections showing steps in a method for manufacturing a semiconductor device in accordance with a third preferred embodiment of the present invention.
Figure 20:
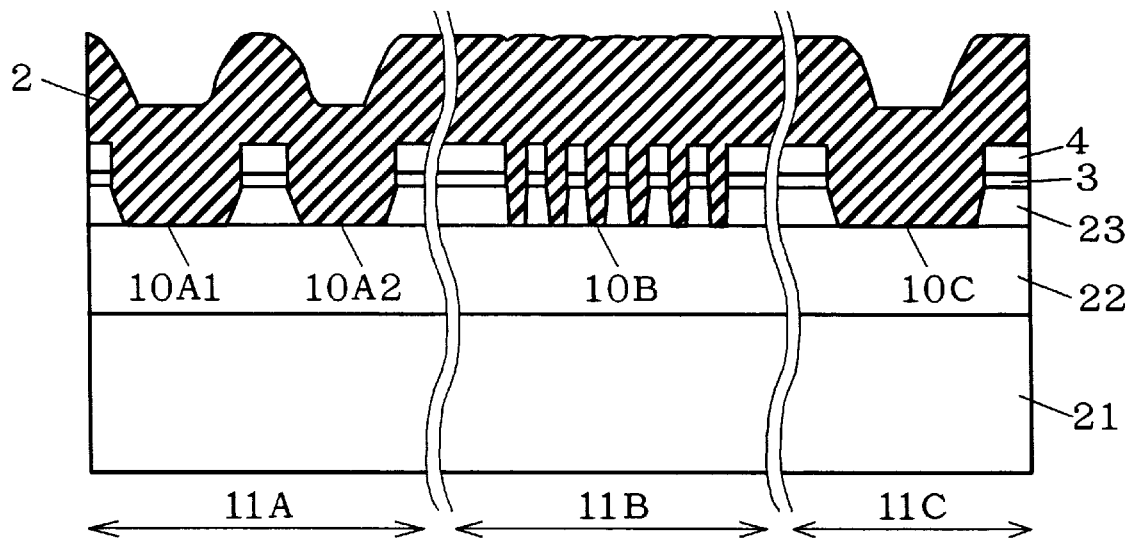

Through the same steps as the second preferred embodiment, the trenches 10A to 10C are formed so that the bottom thereof may be provided on the interface of the SOI layer 23 and the buried oxide film 22, as shown in FIG. 19, and the silicon oxide film 2 is entirely deposited as shown in FIG. 20.

Figure 21:
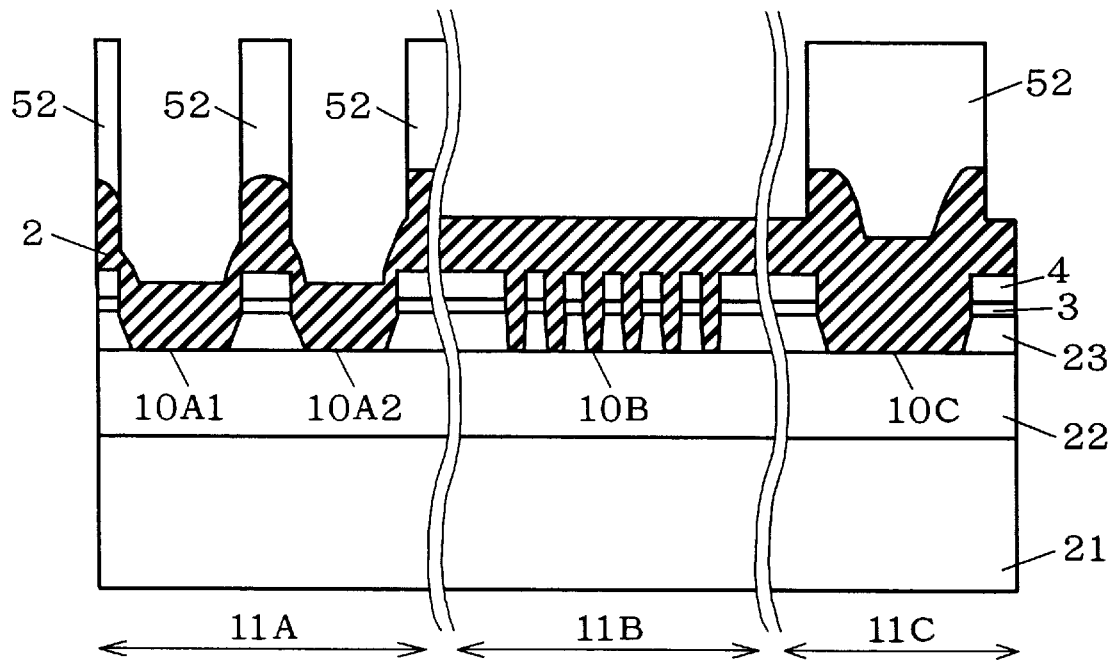

Then, as shown in FIG. 21, to reduce the thickness difference of silicon oxide film on trench, the resist pattern 52 is formed with the preetching mask on the convex portions of the silicon oxide film 2 (the silicon oxide film 2 in the vicinity region of the peripheral portions of the trenches 10A (10A1, 10A2)) and the buried silicon oxide film 2 on the trench 10C, and the preetching is performed by dry etching, to remove the silicon oxide film 2 on the whole surface of the memory cell area 11B and part of the alignment mark area 11A and the peripheral circuit area 11C.

As a result, since the convex portions of the silicon oxide film 2 in the alignment mark area 11A are entirely covered with the resist pattern 52, the difference in height between the silicon oxide films 2 on the trenches 10A in the alignment mark area 11A and those in other areas further increases after the preetching.

Figure 22:
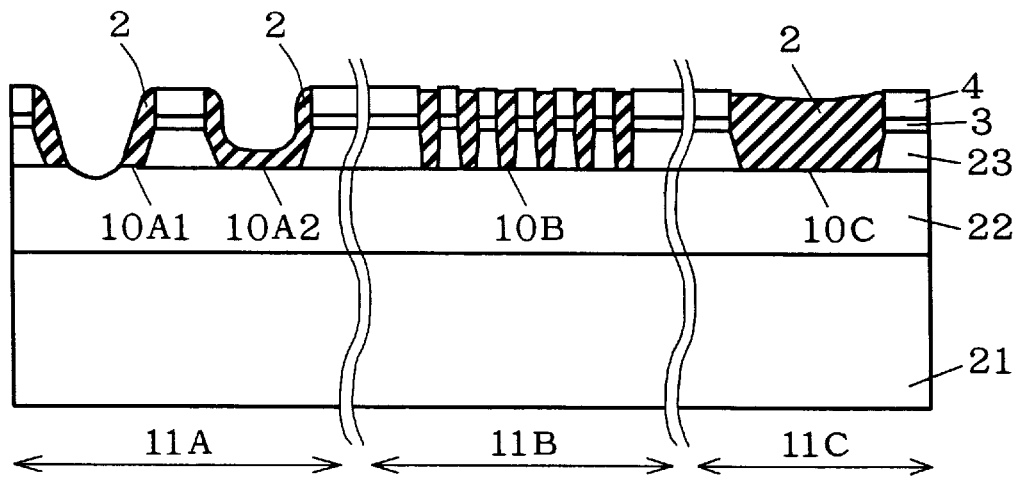

Subsequently, as shown in FIG. 22, the resist pattern 52 is removed and then the silicon oxide film 2 on the silicon nitride film 4, part of the silicon oxide films 2 on the trenches 10A to 10C and part of the silicon nitride film 4 are removed through entirely polishing by CMP. At this time, the silicon oxide film 2 on the center portion of the trench 10A1 which is wider than the trench 10A2 is all removed and further part of the buried oxide film 22 beneath the center portion of the trench 10A1 is removed, to form the deepest portion. Furthermore, the silicon nitride film 4 on the alignment mark area 11A is slightly thicker than those on other portions.

Figure 23:
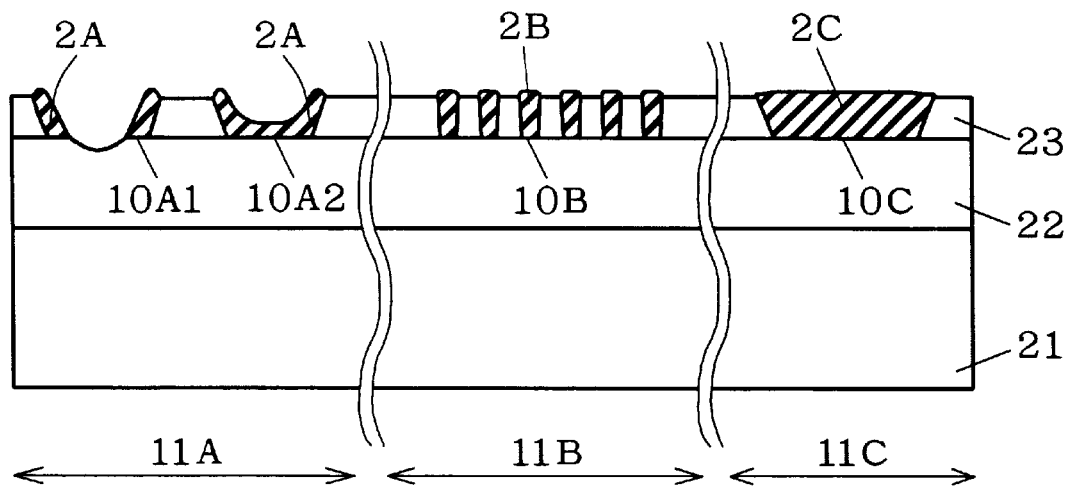

Next, as shown in FIG. 23, the silicon nitride film 4 is removed with phosphoric acid and the silicon oxide film 3 and the part of the silicon oxide film 2 are removed with hydrofluoric acid, to form the buried silicon film 2A in the alignment mark area 11A, the buried silicon film 2B in the memory cell area 11B and the buried silicon film 2C in the peripheral circuit area 11C which constitute the trench isolation structure.

Figure 24:
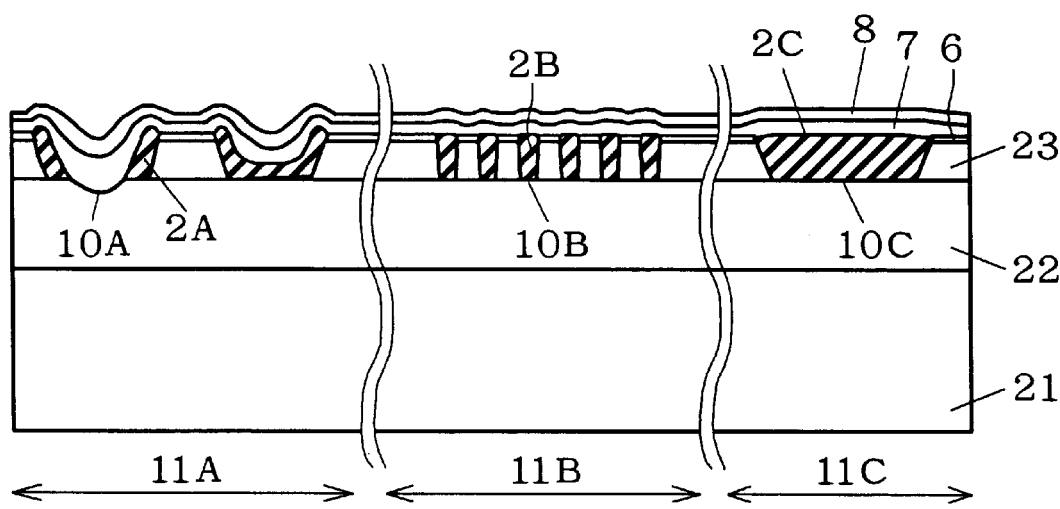

Subsequently, like in the first preferred embodiment, as shown in FIG. 24, the gate oxide film 6 is formed and the polysilicon film 7 doped with phosphorus and the tungsten silicide film 8 are formed on the gate oxide film 6 in this order.

Next, with the alignment mark (the buried silicon oxide film 2A (+the trench 10A1)) of the third preferred embodiment which is formed in the step of forming the isolation structure in the alignment mark area 11A, the pattern for superimposing the gate electrode in the isolation region is formed by photolithography, and the gate electrodes are formed in the memory cell area 11B and the peripheral circuit area 11C through partially removing part of the tungsten silicide film 8 and the polysilicon film 7 by dry etching.

In the semiconductor device of the third preferred embodiment, the alignment mark (the buried silicon oxide film 2A (+the trench 10A1)) has a height difference like that of the second preferred embodiment, and therefore, even when the gate electrode material is formed thereon, the gate electrode material reflects a the height difference of the buried silicon oxide film 2A.

As a result, in the patterning of the gate electrode, with easy detection of the alignment mark using the height difference of the gate electrode material, a resist pattern is formed through accurate superimposition of the gate mask, whereby the gate electrode can be patterned with high accuracy.

In the structure such as the trench 10A1 where part of the buried oxide film 22 is removed, especially, it is possible to increase the height difference of the alignment mark which is restricted by the thickness of the silicon nitride film 4 formed on the SOI layer 23 by further removing the buried oxide film 22.

<The Fourth Preferred Embodiment>

The semiconductor device of the fourth preferred embodiment has a structure taking advantage of the third preferred embodiment which allows an increase of the height difference between the highest and lowest portions of the alignment mark (the silicon oxide film 2A+the trench 10A1) by removing part of the buried oxide film 22 beneath the center portion of the trench 10A1.

FIGS. 26 to 29 are cross sections showing steps in a method for manufacturing a semiconductor device with trench isolation structure in accordance with the fourth preferred embodiment of the present invention. With reference to these figures, the method for manufacturing the semiconductor device of the fourth preferred embodiment will be discussed below.

Like the third preferred embodiment, the silicon oxide film 3 is formed on the SOI layer 23 to have a thickness of about 100 to 300 Å, and the silicon nitride film 4 is formed on the silicon oxide film 3 to have a thickness of 1000 to 4000 Å.

Figure 25:
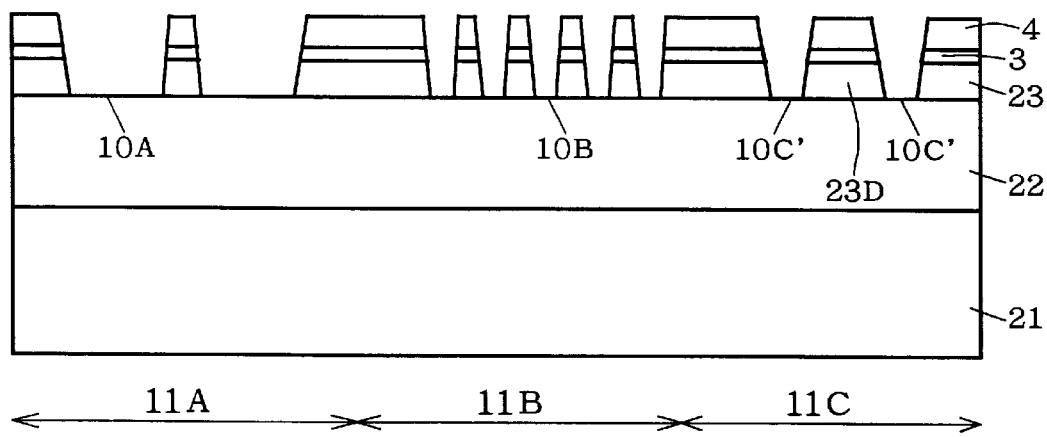
FIGS. 25 to 29 are cross sections showing steps in a method for manufacturing a semiconductor device in accordance with a fourth preferred embodiment of the present invention.

Through the same steps as the second preferred embodiment, the trenches 10A to 10C' are formed so that the bottom thereof may be provided on the interface of the SOI layer 23 and the buried oxide film 22, as shown in FIG. 25. At this time, the trenches 10C' in the peripheral circuit area 11C are formed to be relatively narrow like the trenches 10B in the memory cell area 11B. The trenches 10C' are formed so as to sandwich the SOI layer 23 therebetween. The SOI layer 23 between the trenches 10C' is designated as a dummy pattern 23D.

Figure 26:
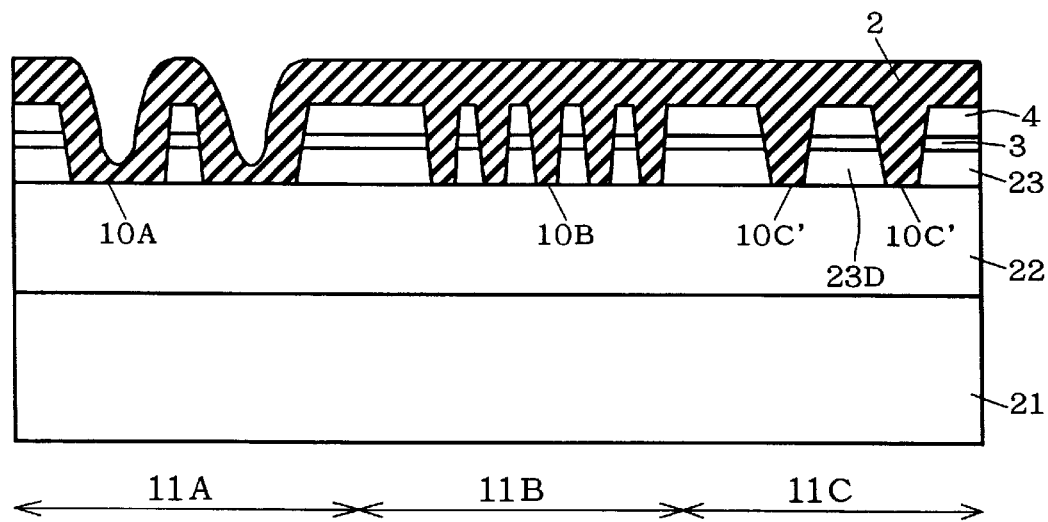

Subsequently, the silicon oxide film 2 is entirely deposited as shown in FIG. 26. The silicon oxide film 2 is formed so as to have almost the same thickness as the silicon oxide film 2 on the memory cell area 11B and the peripheral circuit area 11C after the preetching of the third preferred embodiment (see FIG. 15).

Figure 27:
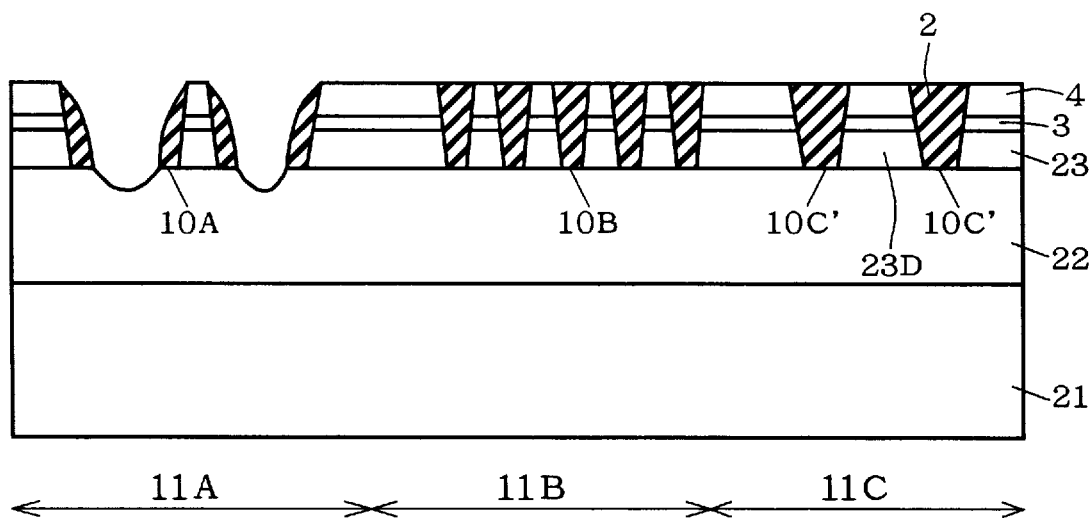

Subsequently, as shown in FIG. 27, the silicon oxide film 2 on the silicon nitride film 4 and part of the silicon oxide films 2 on the trenches 10A to 10C' are removed through entirely polishing by CMP. At this time, the silicon oxide film 2 on the center portion of the trench 10A is all removed and further part of the buried oxide film 22 beneath the center portion of the trench 10A is removed.

Next, the silicon nitride film 4 and the silicon oxide film 3 are removed, to form the trench isolation structure. In this case, the peripheral circuit area 11C is isolated with the isolation structure consisting of the dummy pattern 23D and the trenches 10C' sandwiching the dummy pattern 23D. If the dummy pattern is formed to be wider, it is possible to obtain almost the same width of isolation region as that of the trench 10C in the first to third preferred embodiments.

Figure 28:
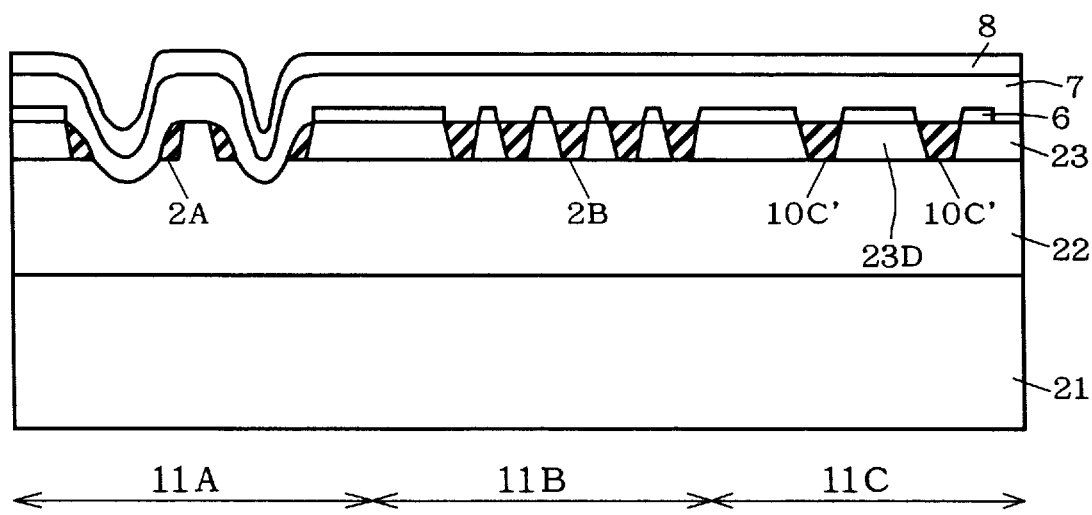

Subsequently, like in the first preferred embodiment, as shown in FIG. 28, the gate oxide film 6 is formed and the polysilicon film 7 doped with phosphorus and the tungsten silicide film 8 are formed on the gate oxide film 6 in this order.

Next, with the alignment mark (the buried silicon oxide film 2A+the trench 10A) of the fourth preferred embodiment which is formed in the step of forming the isolation structure in the alignment mark area 11A, the pattern for superimposing the gate electrode in the isolation region is formed by photolithography, and the gate electrodes 14 are formed in the memory cell area 11B and the peripheral circuit area 11C through partially removing part of the tungsten silicide film 8 and the polysilicon film 7 by dry etching.

Figure 29:
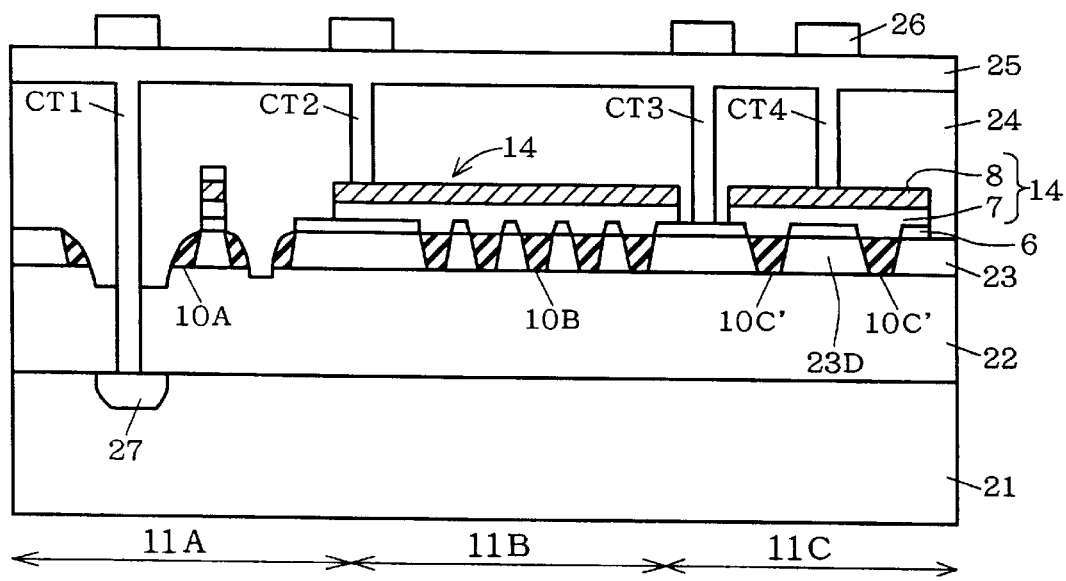

After that, a source/drain region is formed, and as shown in FIG. 29, an interlayer insulating film 24 is formed, in which contact holes CT1 to CT4 are provided, and an aluminum layer 25 is entirely formed. At this time, the contact hole CT1 is formed so as to penetrate the buried oxide film 22 until it reaches a diffusion region 27 in the underlying substrate 21 and the contact holes CT2 and CT4 are formed so as to penetrate the interlayer insulating films 24 until they reach the gate electrodes 14.

Patterning of aluminum is performed by dry etching in a plasma atmosphere. In this etching, there is a fear of degradation in characteristics of the device due to etching damage. The etching damage refers to deterioration of the device caused by potential difference between the substrate and the gate electrode electrified with electric charges which are introduced from the etchant, propagating through the aluminum, to the gate electrode 14.

In the method of the fourth preferred embodiment, as shown in FIG. 29, the contact hole CT1 is formed on the trench 10A in the alignment mark area 11A to provide a dummy pattern of aluminum and the aluminum layer 25 and the highly-concentrated N-type diffusion region 27 in the underlying substrate 21 are electrically connected through the contact hole CT1. On the other hand, the aluminum layer 25 and the gate electrode 14 are electrically connected through the contact holes C12 and CT4.

In the patterning of the aluminum layer 25 after entirely forming the resist 26, since the underlying substrate 21 and the gate electrode 14 are electrically connected through the aluminum layer 25, the potential difference between the substrate potential of the underlying substrate 21 and gate electrode 14 decreases, to significantly reduce the etching damage. As a result, a semiconductor device of excellent performance can be provided.

Figure 30:
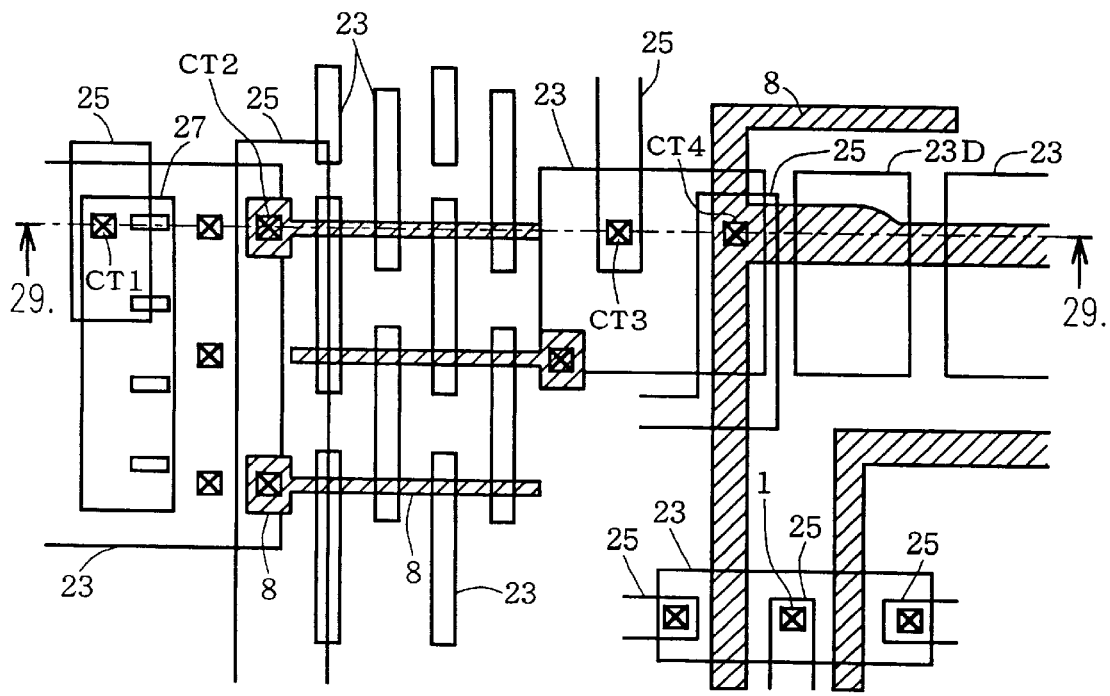
FIG. 30 is a plan view showing a structure of the semiconductor device in accordance with the fourth preferred embodiment of the present invention.

FIG. 30 is a plan view showing a constitution after the patterning of aluminum. FIG. 29 corresponds to a cross section taken along the line A—A of this figure. As shown in FIG. 29, the aluminum layer 25 connected to the gate electrode 14 after patterning is electrically insulated from the aluminum layer 25 connected to the underlying substrate 21 through the contact hole CT1, and therefore no problem arises in operation after completing the device. Blanks between the SOI layers 23 in FIG. 30 are formation regions for the buried silicon oxide films.

Further, since the deepest portion of the trench 10A is formed by partially removing the buried oxide film 22 and the buried oxide film 22 beneath the deepest portion of the trench 10A is thinner, it is possible to perform relatively easy formation of the contact hole CT1 penetrating the buried oxide film 22.

Though the dummy pattern of aluminum is formed in the contact hole CT1 of the alignment mark area 11A in the fourth preferred embodiment, the dummy pattern may be formed in a constitution where the buried oxide film 22 is removed after the CMP polishing, which is provided in such an available area as the peripheral circuit area, for convenience of constitution.

Furthermore, in the fourth preferred embodiment, the trench 10C' in the peripheral circuit area 11C is relatively narrower to leave the SOI layer which would be removed for trench as the dummy pattern 23D, and the dummy pattern 23D and the two trenches 10C' sandwiching the dummy pattern 23D constitute an isolation region.

Because of little difference in width between the trenches 10B and 10C', there is no difference in film thickness between the silicon oxide film 2 on the memory cell area 11B and that on the peripheral circuit area 11C.

Therefore, by simpler manufacturing process without preetching, the alignment mark consisting of the trench 10A and the silicon oxide film 2A can be formed with high accuracy in the alignment mark area 11A.

Further, since each of the trenches 10C' is relatively narrow like the trench 10B, it is possible to prevent dishing (large removal in a center portion of a trench) due to the CMP polishing. Thus, in the semiconductor device of the fourth preferred embodiment, provision of the dummy pattern 23D in the peripheral circuit area 11C allows CMP polishing without preetching even if there is a difference in density of pattern between the memory cell area 11B and the peripheral circuit area 11C, and because of no necessity of considering an error in film thickness of the silicon oxide film 2 after preetching, the CMP polishing can be performed under a polishing condition with larger margin.

Figure 31:
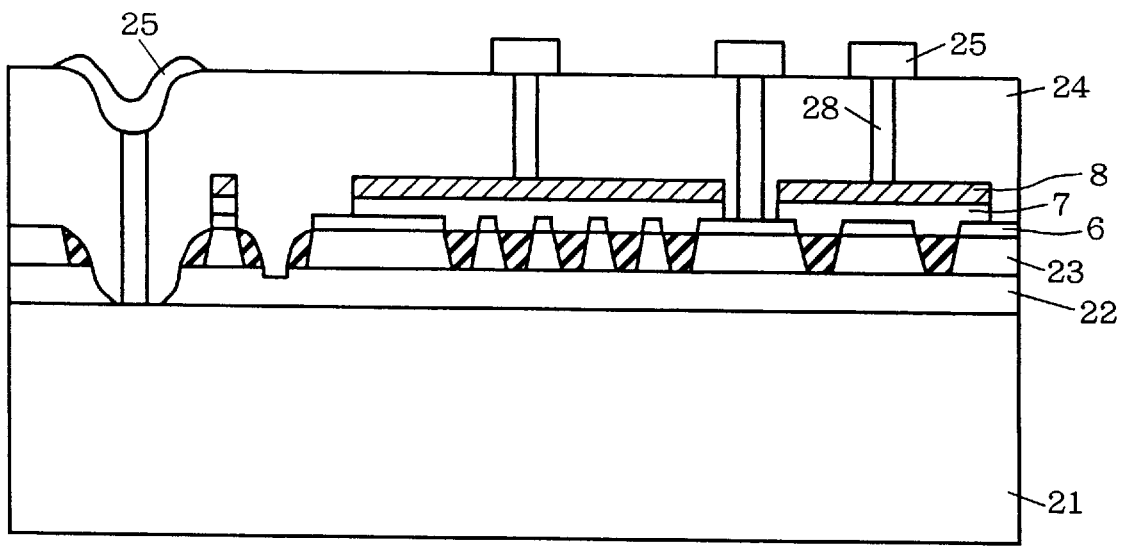
FIG. 31 is a cross section showing a modified structure of the semiconductor device in accordance with the fourth preferred embodiment of the present invention.

Moreover, when the film thickness of the interlayer insulating film 24 is made uniform in the formation region for the substrate-connecting contact hole CT1 and that for the gate-connecting contact holes CT2 and CT4 as shown in FIG. 31, as the contact holes CT1 to CT4 have almost the same formation length, the contact holes can be formed under an etching condition with larger margin. In FIG. 31, the contact holes CT1 to CT4 are filled with tungsten layers 28 and aluminum layers 25 are formed on the tungsten layers 28.

If an object is only to reduce etching damage in patterning the aluminum layer 25, formation of the contact holes and deposition and patterning of the aluminum layer may be performed after forming the isolation region and the alignment mark, with preetching, to provide the gate electrode, like the third preferred embodiment.

<The Fifth Preferred Embodiment>

Figure 32:
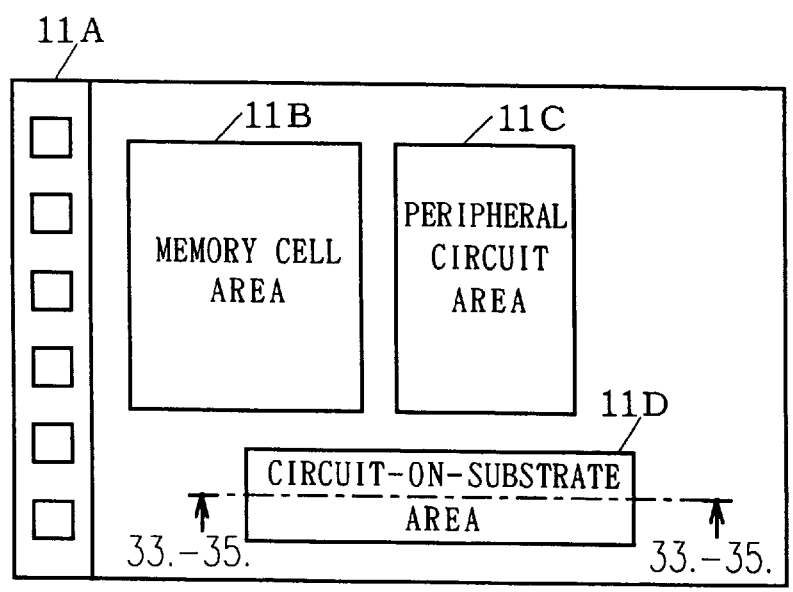
FIG. 32 is a plan view showing a structure of a semiconductor device in accordance with a fifth preferred embodiment of the present invention.

The semiconductor device of the fifth preferred embodiment is obtained by providing a constitution involving a circuit-on-substrate area 11D as shown in the plan view of FIG. 32 in addition to the constitution of the third preferred embodiment.

Figure 33:
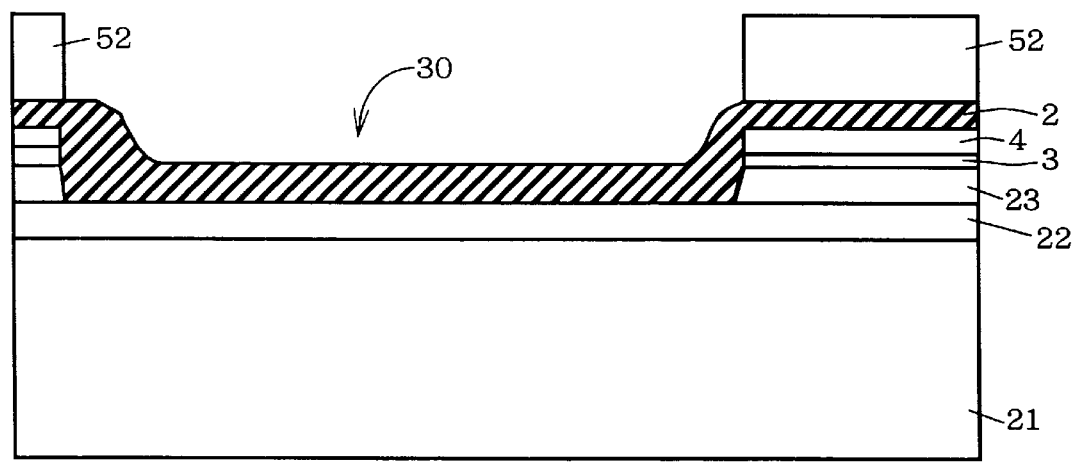
FIGS. 33 to 35 are cross sections showing steps in a method for manufacturing the semiconductor device in accordance with the fifth preferred embodiment of the present invention.
Figure 34:
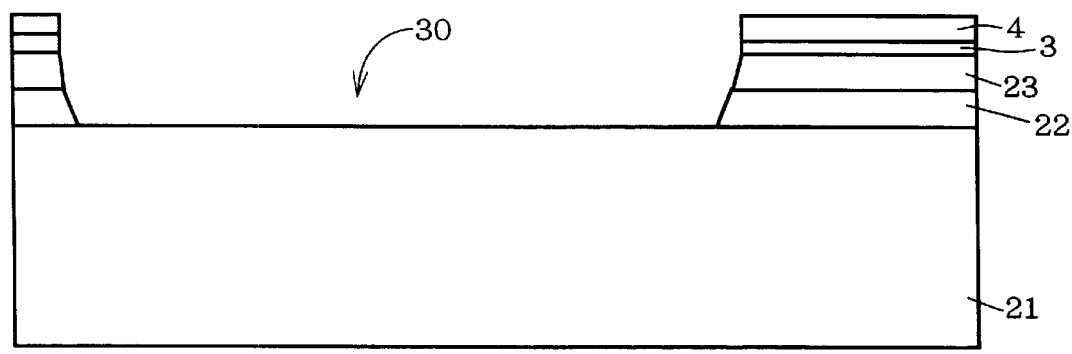
Figure 35:
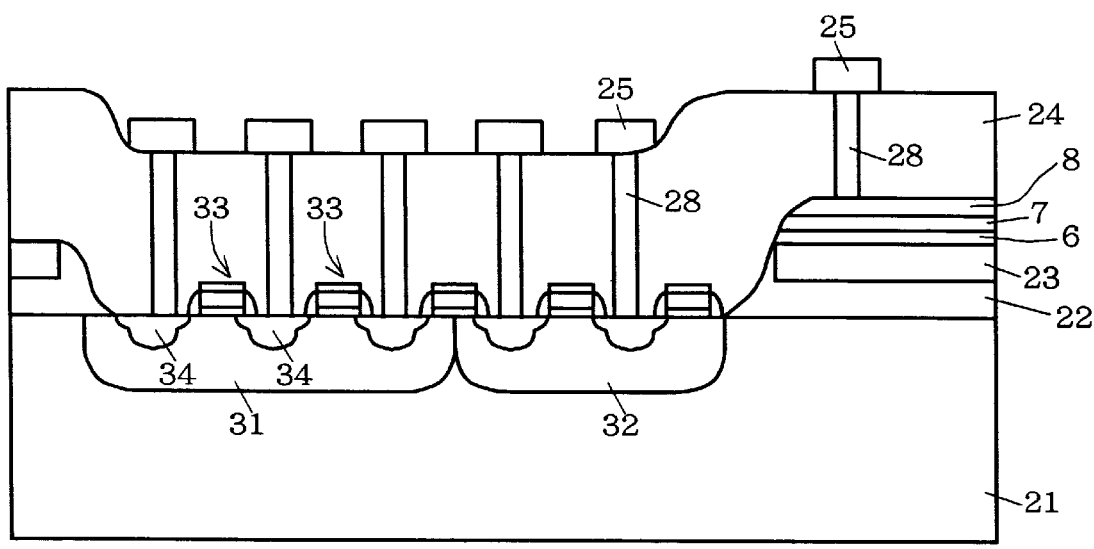

FIGS. 33 to 35 are cross sections showing steps in a method for manufacturing the semiconductor device in accordance with the fifth preferred embodiment of the present invention, taken along the line of B—B of FIG. 32. Furthermore, the manufacturing method of the fifth preferred embodiment is made of the manufacturing steps in the third preferred embodiment and additional steps for manufacturing a circuit on the underlying substrate.

An extremely wide trench 30 is formed when the trenches 10A to 10C are formed (the step of FIG. 19 in the third preferred embodiment), and the resist pattern 52 is left on the portion other than the trench 30, as shown in FIG. 33, in preetching (the step of FIG. 21 of the third preferred embodiment).

In the CMP polishing (the step of FIG. 22 of the third preferred embodiment), the buried oxide film 22 beneath the trench 30 is removed by dishing effect to completely expose the underlying substrate 21.

Semiconductor elements are formed in the trench 30 on the underlying substrate 21 by the already-existing steps as shown in FIG. 35. FIG. 35 shows well regions 31 and 32, a gate portion of LDD structure 33 and (double) diffusion region 34.

Thus, in the semiconductor device of the fifth preferred embodiment, semiconductor elements can be directly formed on the underlying substrate 21 as well as on the SOI layer 23. Through forming a digital circuit and semiconductor elements for low power consumption on the SOI layer 23 and forming an analog circuit, semiconductor elements with high breakdown voltage (transistors constituting an input/output circuit which requires improvements in resistance to ESD (Electric Static Discharge) and high drain breakdown voltage, a sense amplifier, a word line driving circuit or a step-up transforming circuit) on the underlying substrate 21, the semiconductor elements can be formed on one of the underlying substrate 21 and the SOI layer 23 which is more suitable for their uses.

The manufacturing method of the fifth preferred embodiment may be performed in parallel with that of the fourth preferred embodiment as below.

Figure 36:
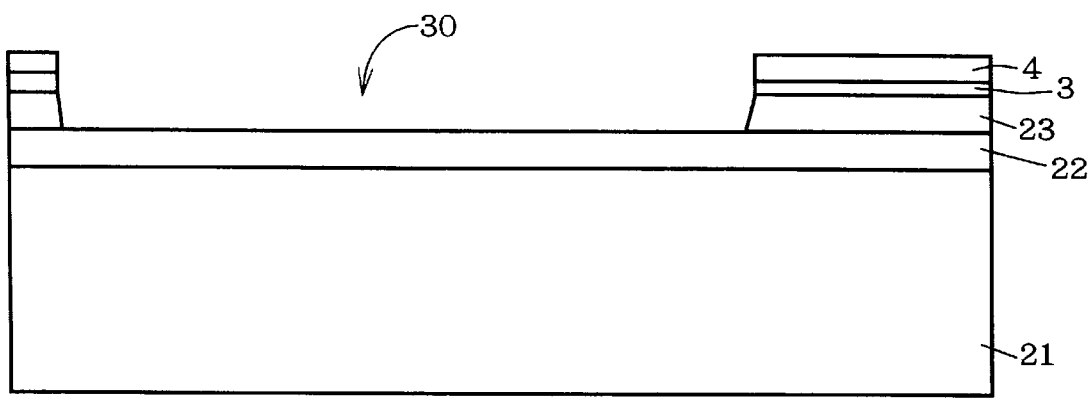
FIG. 36 is a cross section showing another method for manufacturing the semiconductor device in accordance with the fifth preferred embodiment of the present invention.
Figure 37:
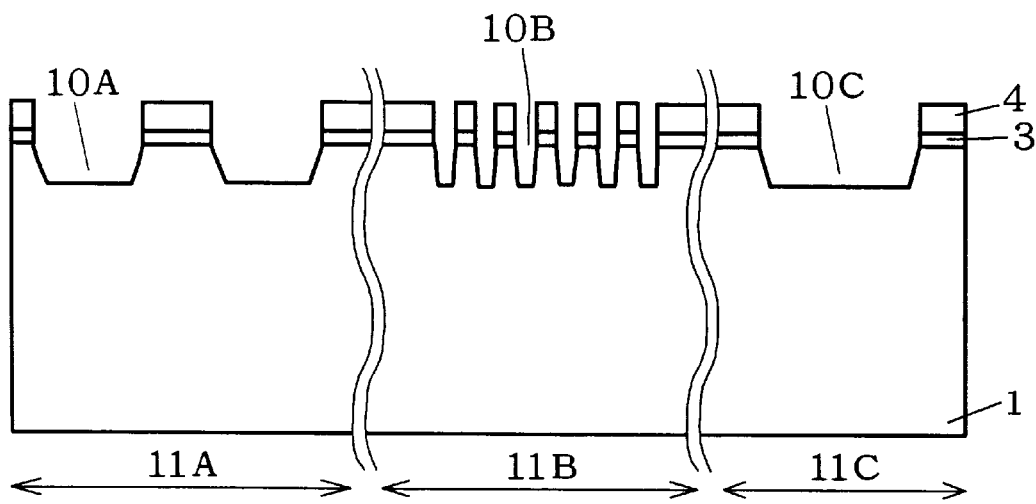
FIGS. 37 to 43 are cross sections showing steps in a method for manufacturing a semiconductor device as a trial example.
Figure 38:
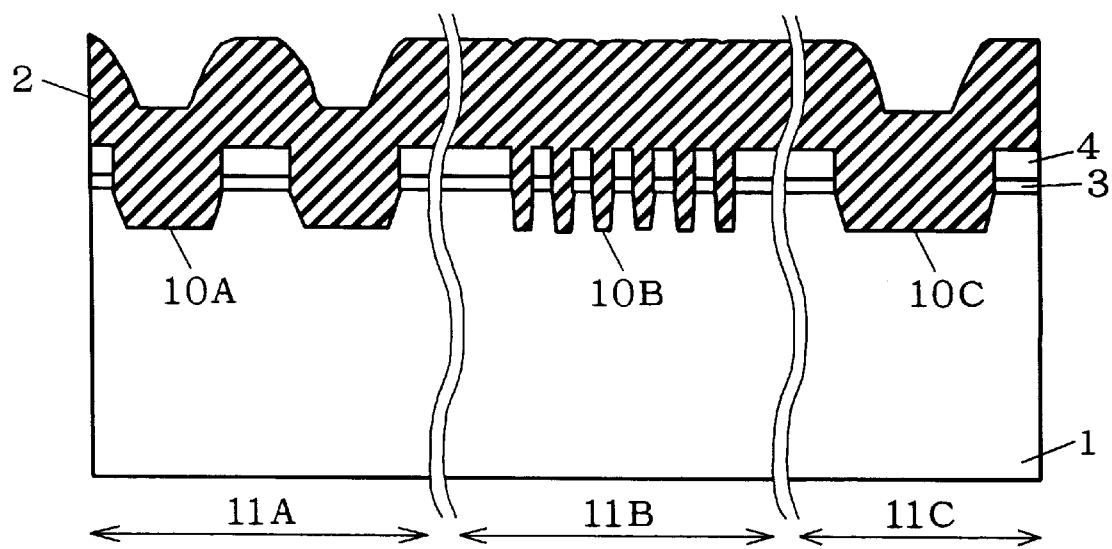

The very wide trench 30 is formed when the trenches 10A to 10C are formed (the step of FIG. 25 in the fourth preferred embodiment) as shown in FIG. 36.

After the CMP polishing (the step of FIG. 24 of the third preferred embodiment), the buried oxide film 22 beneath the trench 30 is removed by dishing effect to completely expose the underlying substrate 21. The remainder of the manufacturing steps are the same as discussed earlier.

While the invention has been shown and described in detail, the foregoing description is in all aspects illustrative and not restrictive. It is therefore understood that numerous modifications and variations can be devised without departing from the scope of the invention.

I claim:

1. A semiconductor device in which semiconductor elements are isolated with a trench isolation structure, comprising:

a semiconductor substrate;

an alignment mark area provided on said semiconductor substrate and having a first trench in an upper portion of said semiconductor substrate and an alignment insulating film provided in said first trench, said alignment insulating film being formed in a peripheral portion other than a center portion of said first trench; and an element formation area provided on said semiconductor substrate and having an isolation insulating film used for isolating a plurality of semiconductor elements, said isolation insulating film filling a second trench provided in said upper portion of said semiconductor substrate, a bottom surface of said center portion of said first trench being formed deeper than a bottom surface of said second trench, wherein said alignment insulating film has a height difference between a highest portion of said alignment insulating film and said bottom surface of said center portion.

2. The semiconductor device of claim 1, wherein said highest portion of said alignment insulating film is formed higher than a surface of said semiconductor substrate.

3. The semiconductor device of claim 1, wherein said semiconductor substrate includes an SOI substrate having an underlying substrate, a buried insulating film formed on said underlying substrate and an SOI layer formed on said buried insulating film, and said first and second trenches penetrate said SOI layer and said center portion of said first trench is formed by further removing a part of said buried insulating film.

4. The semiconductor device of claim 3, further comprising:

a control electrode provided on said element formation area, for controlling a device operation;

an interlayer insulating film provided on said semiconductor substrate including said control electrode and a portion above said first trench;

a first through hole penetrating said interlayer insulating film, said center portion of said first trench and said buried insulating film to reach said underlying substrate;

a second through hole penetrating said interlayer insulating film to reach said control electrode; and an interconnection layer electrically connected to said control electrode through said second through hole.

5. The semiconductor device of claim 4, further comprising an element-on-underlying-substrate formation area being said underlying substrate in which semiconductor elements are formed.

* * * * *